US012381512B2

(12) United States Patent
Tabrizian et al.

(10) Patent No.: US 12,381,512 B2
(45) Date of Patent: Aug. 5, 2025

(54) SELF-AMPLIFIED RESONATORS WITH EMBEDDED PIEZORESISTIVE ELEMENTS FOR HIGH PERFORMANCE, ULTRA-LOW SWaP MICROWAVE AND MILLIMETER-WAVE APPLICATIONS

(71) Applicants: University of Florida Research Foundation, Inc., Gainesville, FL (US); NATIONAL TECHNOLOGY & ENGINEERING SOLUTIONS OF SANDIA, LLC, Albuquerque, NM (US)

(72) Inventors: Roozbeh Tabrizian, Gainesville, FL (US); Kevin S. Jones, Gainesville, FL (US); George T. Wang, Albuquerque, NM (US)

(73) Assignees: University of Florida Research Foundation, Inc., Gainesville, FL (US); NATIONAL TECHNOLOGY & ENGINEERING SOLUTIONS OF SANDIA, LLC, Albuquerque, NM (US)

( * ) Notice: Subject to any disclaimer, the term of this patent is extended or adjusted under 35 U.S.C. 154(b) by 0 days.

(21) Appl. No.: 18/519,503

(22) Filed: Nov. 27, 2023

(65) Prior Publication Data
US 2024/0162859 A1    May 16, 2024

Related U.S. Application Data

(63) Continuation-in-part of application No. PCT/US2022/072568, filed on May 25, 2022.
(Continued)

(51) Int. Cl.
*H03B 5/32* (2006.01)
*H03H 9/02* (2006.01)
(Continued)

(52) U.S. Cl.
CPC ......... *H03B 5/326* (2013.01); *H03H 9/02015* (2013.01); *H03H 9/173* (2013.01); *H03H 9/703* (2013.01)

(58) Field of Classification Search
CPC .... H03H 9/02015; H03H 9/173; H03H 9/703; H03H 9/02259; H03H 9/02338;
(Continued)

(56) References Cited

U.S. PATENT DOCUMENTS

2015/0364542 A1*  12/2015  Rodder ............ H01L 29/78696
                                                        257/29
2018/0248007 A1*   8/2018  Hatem ............. H01L 29/42392
(Continued)

OTHER PUBLICATIONS

International Search Report mailed Feb. 28, 2023 for PCT Application PCT/US2022/072568.

*Primary Examiner* — Jeffrey M Shin
(74) *Attorney, Agent, or Firm* — Thomas|Horstemeyer, LLP

(57) ABSTRACT

In one aspect, the disclosure relates to a super high frequency (SHF) or extremely high frequency (EHF) bulk acoustic resonator that includes a nanostructure, wherein the nanostructure includes a substrate, a three-dimensional structure disposed on the substrate, wherein the three-dimensional structure includes a planar structure including at least one nanocomponent and a matrix material contacting the nanocomponent on at least one side, the matrix material including an SiGe alloy or Ge. The disclosed bulk acoustic resonator operates at frequencies of from about 100 MHz to about 100 GHz, is capable of self-amplification upon application of direct current or voltage, and has a Q factor amplification exceeding 1. Also disclosed are methods for amplification of mechanical resonance in the disclosed bulk acoustic resonators and devices incorporating the bulk acoustic resonators.

18 Claims, 17 Drawing Sheets

Related U.S. Application Data

(60) Provisional application No. 63/223,668, filed on Jul. 20, 2021, provisional application No. 63/194,589, filed on May 28, 2021.

(51) Int. Cl.
*H03H 9/17* (2006.01)
*H03H 9/70* (2006.01)

(58) Field of Classification Search
CPC ............. H03H 9/02409; H03H 9/2405; H03H 9/02433; H03H 9/467; H03H 9/525; H03H 3/007; H03H 3/0072; H03H 2009/02314
See application file for complete search history.

(56) References Cited

U.S. PATENT DOCUMENTS

| | | |
|---|---|---|
| 2018/0323767 A1* | 11/2018 | Then ..................... H03H 3/02 |
| 2019/0194801 A1 | 6/2019 | Jin et al. |
| 2019/0245515 A1 | 8/2019 | Hurwitz |
| 2020/0177152 A1 | 6/2020 | Ghatge et al. |
| 2020/0259479 A1 | 8/2020 | Tabrizian |
| 2020/0336136 A1 | 10/2020 | Tabrizian et al. |
| 2021/0036678 A1 | 2/2021 | Burak et al. |

* cited by examiner

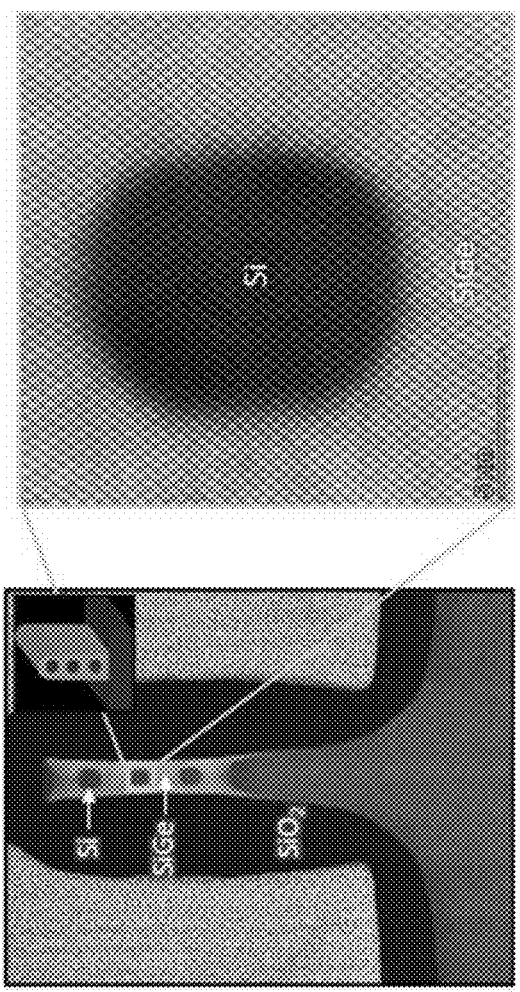
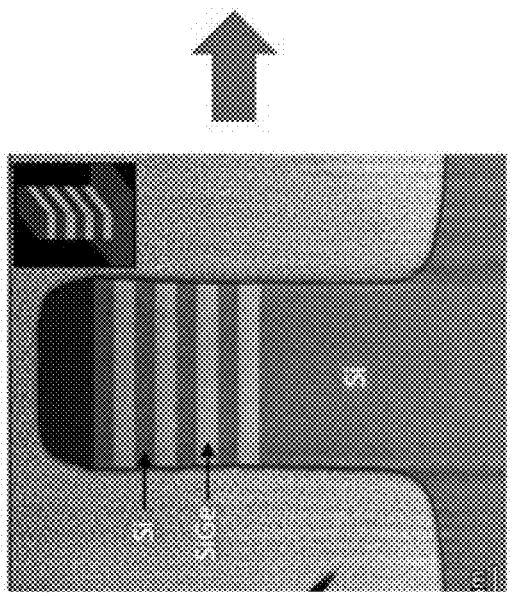
FIG. 8A
FIG. 8B

SELF-AMPLIFIED RESONATORS WITH EMBEDDED PIEZORESISTIVE ELEMENTS FOR HIGH PERFORMANCE, ULTRA-LOW SWaP MICROWAVE AND MILLIMETER-WAVE APPLICATIONS

CROSS REFERENCE TO RELATED APPLICATIONS

This application is a continuation-in-part of International Application No. PCT/US2022/072568, filed May 25, 2022, which claims the benefit of U.S. Provisional Application No. 63/223,668 filed on Jul. 20, 2021, and of U.S. Provisional Application No. 63/194,589 filed on May 28, 2021, each of which is incorporated herein by reference in its entirety.

STATEMENT REGARDING FEDERALLY SPONSORED RESEARCH OR DEVELOPMENT

This invention was made with government support under Contract Number DE-NA0003525 awarded by the United States Department of Energy/National Nuclear Security Administration. The government has certain rights in the invention.

BACKGROUND

High performance resonators operating in the super-high-frequency (SHF) regime (3-30 GHz) and extremely-high-frequency (EHF) regime (30-300 GHz) are crucial components needed for oscillators, filters, sensors, actuators, and spectral processors for wireless transceivers. These are used in a range of civil, space, and defense applications in the X to Ka bands including high-resolution radar and high-bandwidth satellite and tactical communications.

In these systems, the resonator quality factor (Q) limits performance metrics such as frequency stability and selectivity, phase noise, insertion loss, and power consumption. Currently, only a few technologies, such as dielectric and ferrite-based resonators, can sustain a high Q (>5,000) in the SHF and EHF regimes. These nonintegrated solutions are bulky, slow to reconfigure and tune, require external active circuitry for operation and Q amplification, and consume significant power (>100 mW). Reduction of size, weight, and power consumption (SWaP) is desirable, but is faced with manufacturing challenges, the requirement for permanent magnets, and other physics-based limitations. Integrated electro-mechanical alternatives, such as piezoelectric surface or bulk acoustic wave resonators and micro- and nano-electro mechanical resonators operating based on Lamb waves, offer radical reduction in SWaP, but are limited to lower frequencies (<6 GHz) before their Q values rapidly degrade. This degradation arises from fundamental mechanical energy dissipation mechanisms that increase with frequency.

Disclosed herein is a self-amplified nanoresonator ("SANR") architecture that enables a transformative, several orders-of-magnitude (OOM) improvement in both the resonator quality factor (Q) and reduction of size, weight, and power consumption (SWaP) for super-high-frequency (SHF) and extremely-high-frequency (EHF) resonators, wherein the smaller the width of the nanowire-nanofin, the higher the frequency. This approach combines disparate nano-enabled elements into a single solution: (1) The use of a nanoscale plate, membrane, or fin acoustic resonator for SHF or EHF operation with resonance modes determined by the thickness of the plate or membrane, or by the width of the nanofin; (2) a recently discovered, piezoresistive-thermal effect in n-type Si nanowires or nanostructures allowing for sustained, self-oscillations when resistively heated; and (3) a stacked architecture where the n-type Si nanowires or nanostructures are embedded within a SiGe, Si, or Ge nanoplate or nanofin architecture with n-type doped Si nanowires or nanostructures are located at specific locations that merges the above elements. The disclosed SANR architecture solutions are compact, enables self-amplification under direct current heating or application of voltage and thus do not require external active circuitry for amplification, and consume significantly less power than current resonators and oscillators.

SUMMARY

In one aspect, the disclosure relates to a super high frequency (SHF) or extremely high frequency (EHF) bulk acoustic resonator that includes a nanostructure, wherein the nanostructure includes a substrate, a three-dimensional structure disposed on the substrate, wherein the three-dimensional structure includes a planar structure including at least one nanocomponent and a matrix material contacting the nanocomponent on at least one side, the matrix material including Si, an SiGe alloy, or Ge. The disclosed bulk acoustic resonator operates at frequencies of from about 100 MHz to about 100 GHz, is capable of self-amplification upon application of direct current or voltage, and has a Q factor amplification exceeding 1. Also disclosed are methods for amplification of mechanical resonance in the disclosed bulk acoustic resonators and devices incorporating the bulk acoustic resonators.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 8A-8B show cross-sectional transmission electron microscope images showing Si/SiGe multilayer fin structure (FIG. 8A) before thermal oxidation and (FIG. 8B) after thermal oxidation, where stacked single crystalline Si nanowires embedded in a SiGe fin forms.

FIG. 10A shows a schematic of one embodiment and FIG. 10B shows micrographs of an exemplary constructed device.

Figure 1A:
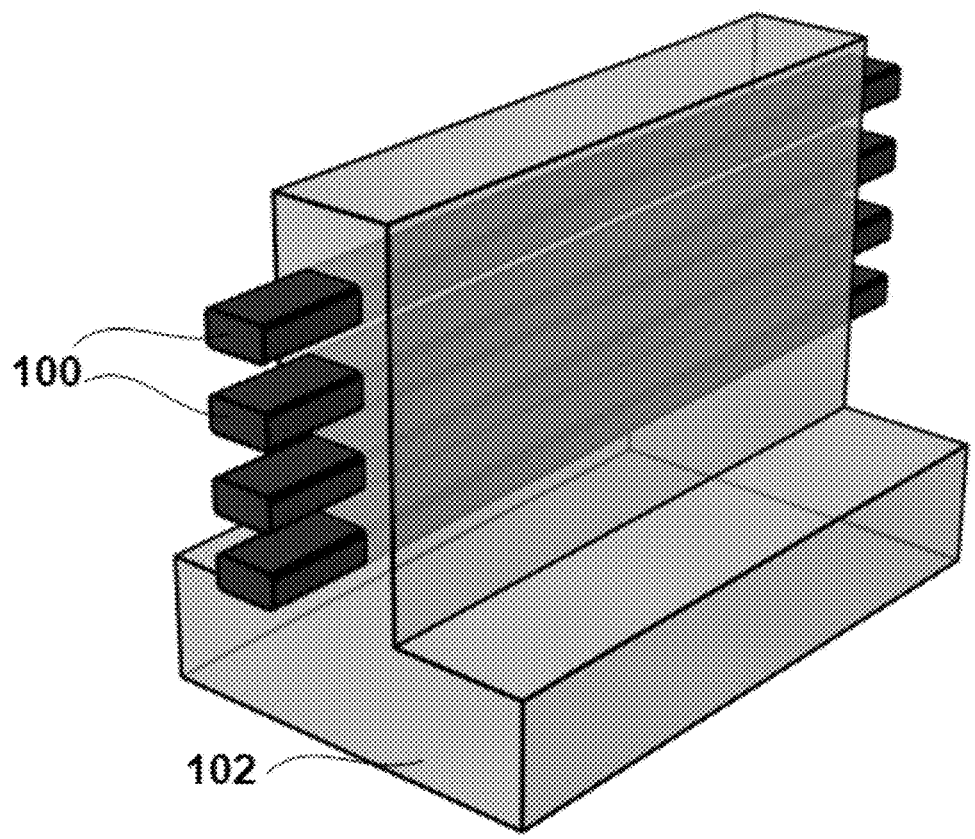
FIG. 1A shows a perspective view of an exemplary SANR architecture with stacked crystalline silicon nanowires embedded in a SiGe nanofin.

It is to be understood that the various layers and/or regions shown in the accompanying drawings are not drawn to scale, and that one or more layers and/or regions of a type commonly used in FinBAR devices may not be explicitly shown in a given drawing. This does not imply that the layers and/or regions not explicitly shown are omitted from the actual Fin BAR devices.

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION

Disclosed herein is a self-amplified silicon/silicon-germanium (Si/SiGe) nanowire-nanofin resonator ("SANR") architecture that enables a transformative, several orders-of-magnitude (OOM) improvement in both the Q and SWaP for SHF resonators. In one aspect, the disclosed approach combines multiple disparate nano-enabled elements into a novel solution: (1) The use of a nanoscale, fin acoustic resonator for SHF operation with resonance modes determined by the nanofin width; (2) a recently discovered, piezoresistive-thermal effect in n-type Si nanowires allowing for sustained, self-oscillations when resistively heated; and (3) a stacked, Si/SiGe nanowire-nanofin architecture that merges the previous two elements. In a further aspect, this unique SANR architecture enables a novel mechanism leading to built-in amplification of Q at SHF by several OOM without the need for external amplification and other circuits that currently limit SWaP.

In one aspect, disclosed herein is an SHF or EHF bulk acoustic resonator that includes a nanostructure, wherein the nanostructure includes a substrate, a three-dimensional structure disposed on the substrate, wherein the three-dimensional structure includes a planar structure having a cross-sectional area with a first axis and a second axis and a width, and wherein the width has a dimension that is smaller than a dimension of either the first axis or the second axis, and wherein the planar structure further includes at least one n-type silicon nanocomponent extending along the first axis, the second axis, or both, and a matrix material contacting the nanocomponent on at least one side, the matrix material including Si, an SiGe alloy, or Ge, wherein the at least one nanocomponent has a first dimension extending less than or equal to the width of the planar structure.

In some aspects, the substrate material is the same as the matrix material, or is different from the matrix material. In one aspect, the first axis of the three-dimensional structure is parallel to the substrate and the second axis of the three-dimensional structure is perpendicular to the substrate. In an alternative aspect, the first axis and the second axis of the three-dimensional structure are parallel to the substrate. In any of these aspects, the three-structure can be a fin and the fin width can be from about 20 to about 1000 nm, or can be about 20, 50, 75, 100, 125, 150, 175, 200, 225, 250, 275, 300, 350, 400, 450, 500, 550, 600, 650, 700, 750, 800, 850, 900, 950, or about 1000 nm, or a combination of any of the foregoing values, or a range encompassing any of the foregoing values. In another aspect, the nanocomponent can have a second dimension having an approximate length of the first axis, the second axis, or both. In one aspect, the bulk acoustic resonator is partially suspended over a cavity and anchored to the substrate at one or more points.

In an aspect, the three-dimensional structure has an outer surface containing SiGe or Ge material. In another aspect, the three-dimensional structure is or includes a single crystal.

In one aspect, the disclosed bulk acoustic resonator can operate at a frequency of from about 100 MHz to about 100 GHz, or at about 100, 150, 200, 250, 300, 350, 400, 450, 500, 550, 600, 650, 700, 750, 800, 850, 900, or 950 MHz, or about 1, 3, 5, 10, 15, 20, 25, 30, 35, 40, 45, 50, 55, 60, 65, 70, 75, 80, 85, 90, 95, or about 100 GHz, or a combination of any of the foregoing values, or a range encompassing any of the foregoing values.

In some aspects, the at least one nanocomponent, the matrix material, or both include a dopant. In a further aspect, the dopant can be an n-type dopant such as, for example, Sb, P, or As.

In any of these aspects, the at least one nanocomponent may or may not extend on the outer surface of the three-dimensional structure.

In one aspect, the at least one nanocomponent can be a nanowire, or a nanosheet, wherein the nanosheet is perpendicular to the substrate. In an alternative aspect, the at least one nanocomponent is a nanosheet and is parallel to the substrate. In still another aspect, the at least one nanocomponent can be a plurality of nanosheets and the matrix material can be in the form of a plurality of matrix sheets. Further in this aspect, individual members of the plurality of nanosheets alternate in a stack with individual members of the plurality of matrix sheets. In some aspects, the resonator may be comprised of nanocomponents of different dimensions. In one aspect, the resonator may have nanowires of different diameters distributed within.

In some aspects, an external dielectric layer can be conformally deposited on the three-dimensional structure. In one aspect, the external dielectric layer can be or include $SiO_2$.

In some aspects, the bulk acoustic resonator disclosed herein further includes a transducer, wherein the transducer is a piezoelectric or ferroic film. In one aspect, the piezoelectric or ferroic film is sandwiched between a first conductive layer directly adjacent to the nanostructure and an external second conductive layer. In another aspect, a part of the nanostructure can serve as the first conductive layer or an additional conductive layer, such as a third conductive layer. Further in this aspect, the piezoelectric or ferroic film can include aluminum nitride (AlN), scandium-doped aluminum nitride ($Sc_xAl_yN$), hafnium-zirconium-oxide ($Hf_xZr_yO_2$), or any combination thereof. In one aspect, the hafnium-zirconium-oxide can have the formula $Hf_{0.5}Zr_{0.5}O_2$, but other stoichiometries are also contemplated. Still further in this aspect, the first conductive layer, the second conductive layer, or both, or can be or include platinum.

Also disclosed herein is a chip including a plurality of bulk acoustic resonators as disclosed herein. In one aspect, individual bulk acoustic resonators of the plurality are connected mechanically to one another through a medium. In a further aspect, the medium can be a dielectric including, but not limited to, $SiO_2$, a metal including, but not limited to, platinum, or any combination thereof.

In an aspect, including multiple individual resonators on a chip allows for scalability and/or an increase of power handling and linearity. In another aspect, multi-frequency operation can be accomplished on the same chip by variation of individual resonator frequencies on the chip. In still another aspect, including multiple individual resonators on the chip reduces fabrication-induced errors, improves tolerance, and improves stability through an averaging effect.

Also disclosed herein is a method for amplification of mechanical resonance in the bulk acoustic resonator of any one of the preceding claims, the method including at least the step of applying direct current through or voltage across the at least one silicon nanocomponent. In certain aspects, the method does not require use of an external amplifier. In one aspect, the intrinsic Q factor of the bulk acoustic resonator is amplified by a factor larger than 1, such as, for example, $1\times10^1$, $1\times10^2$, $1\times10^3$, $1\times10^4$, $1\times10^5$, $1\times10^6$, $1\times10^7$, or $1\times10^8$, or a combination of any of the foregoing values, or a range encompassing any of the foregoing values. Further disclosed are devices including the bulk acoustic resonators disclosed herein. In one aspect, the device can be an oscillator, a filter, sensor, actuator, or a spectral processor for a wireless transceiver.

Figure 1B:
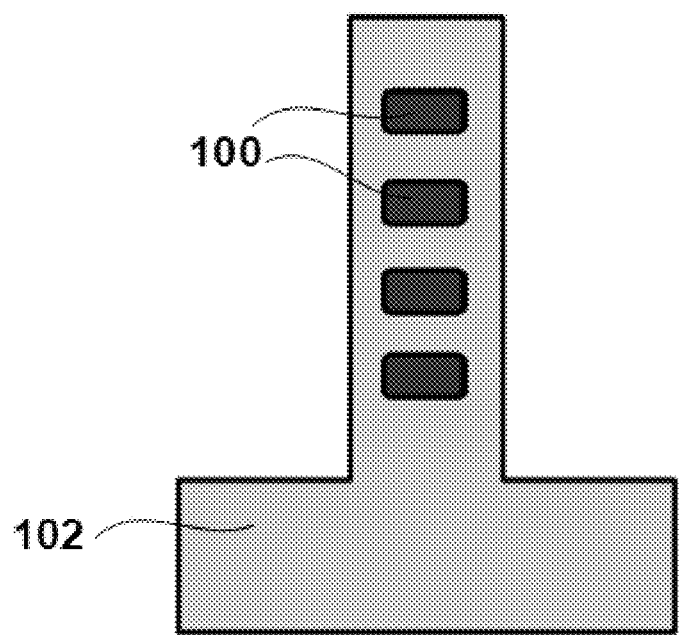
FIG. 1B shows a cross-sectional view of the exemplary SANR architecture of FIG. 1A.

Turning to the drawings, in one aspect, FIGS. 1A-1B show a schematic of one exemplary embodiment of the proposed SANR architecture. Further in this aspect, at its core, the SANR consists of an SiGe nanofin structure 102 with fin width generally below 1 micron, down to around 10 nm. Within the nanofin are embedded vertically stacked nanowires 100; these nanowires 100 are doped so that the wires are conductive compared to the nanofin 102. In this embodiment, the fin 102 is undoped or slightly p-type doped SiGe and the nanowires are n-type doped Si nanowires 100. In the embodiment depicted in FIG. 1A, the nanowires 100 are shown extended beyond the 102 fin for illustrative purposes; in other embodiments, the ends of the nanowires 100 will be flush with the ends of the fin 102. In one aspect, this SANR technology operates based on excitation of bulk acoustic wave (BAW) resonance modes in atomically engineered SiGe fins with embedded strained, doped Si nanowires. In an aspect, benefiting from a single-crystal structure, SiGe fin bulk acoustic resonators (FinBARs) provide very high Q with a frequency defined lithographically by the fin width towards mm-wave regime. Without wishing to be bound by theory, in another aspect, the self-aligned Si nanowires embedded within SiGe fin body enable active amplification of the resonator Q, by a projected 1-3 orders of magnitude, using the piezoresistive internal amplification effect for n-type Si.

Figure 2A:
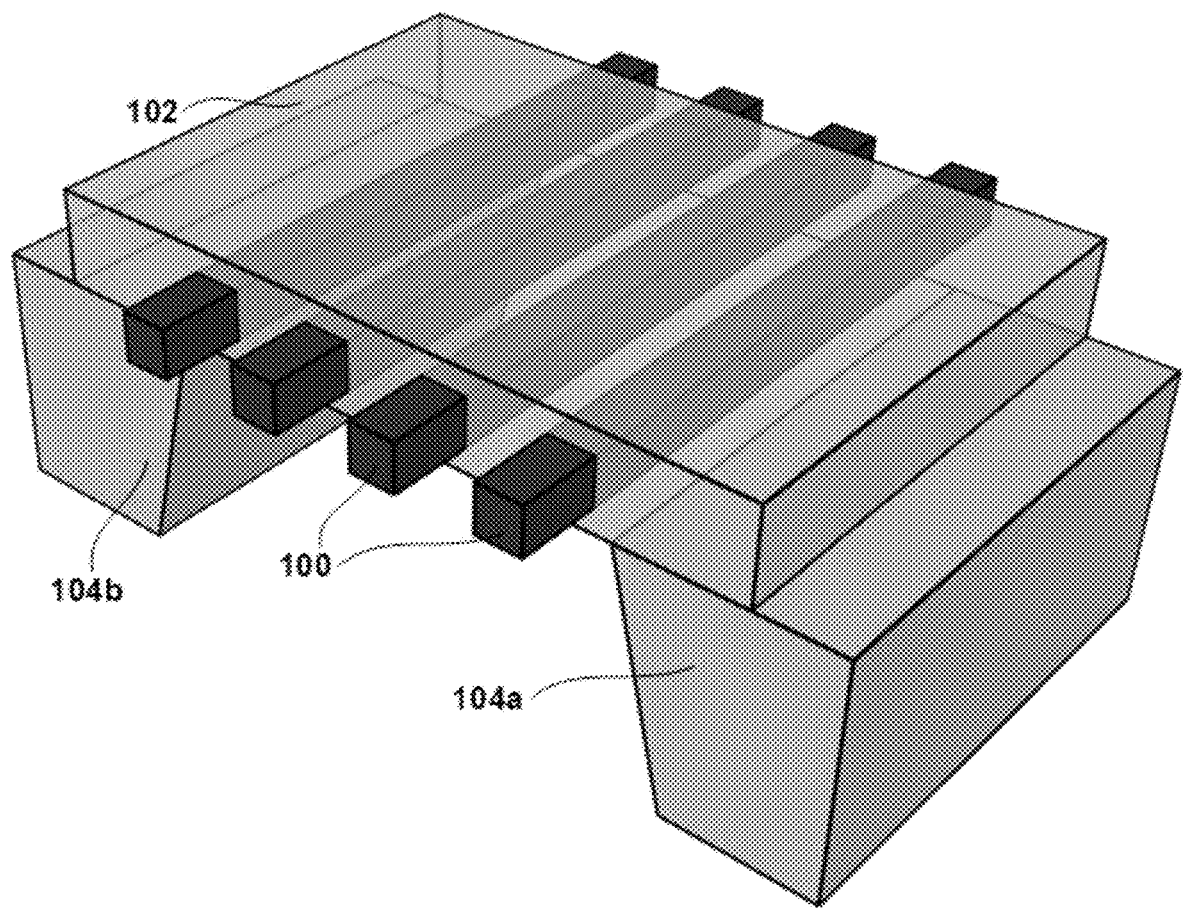
FIG. 2A shows a perspective view of an exemplary SANR architecture with side-by-side crystalline silicon nanowires embedded in a SiGe plate, wherein the SiGe plate rests on two supports on either side of a gap.
Figure 2B:
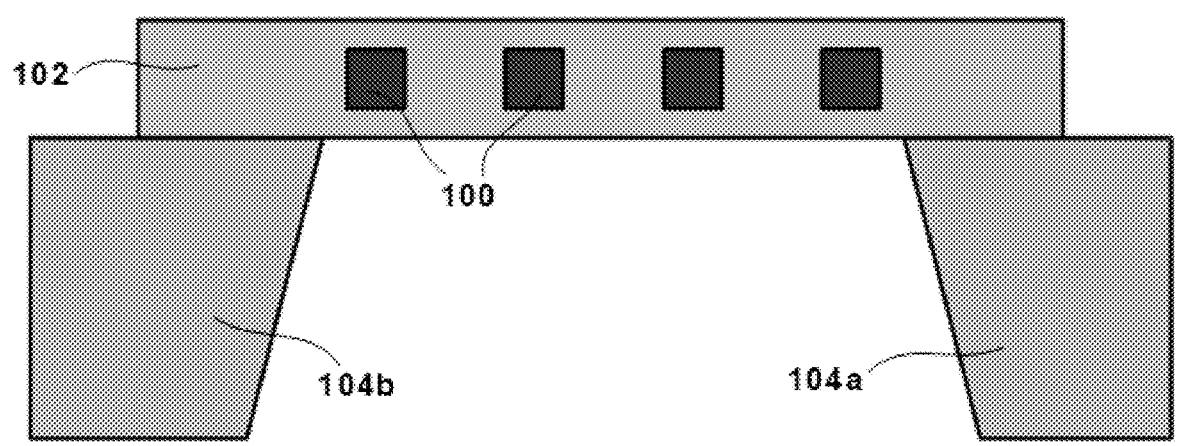
FIG. 2B shows a cross-sectional view of the exemplary SANR architecture of FIG. 2A.

In another aspect, an alternative embodiment is depicted in FIGS. 2A-2B, wherein the SiGe nanofin 102 forms a plate-like structure that can, in some aspects, rest on substrates 104a and 104b, wherein a gap exists between the substrates 104a and 104b. Further in this aspect, nanowires 100 can extend past the edges of the plate-like structure as shown, or can be flush with the edges of the plate-like structure.

Figure 3A:
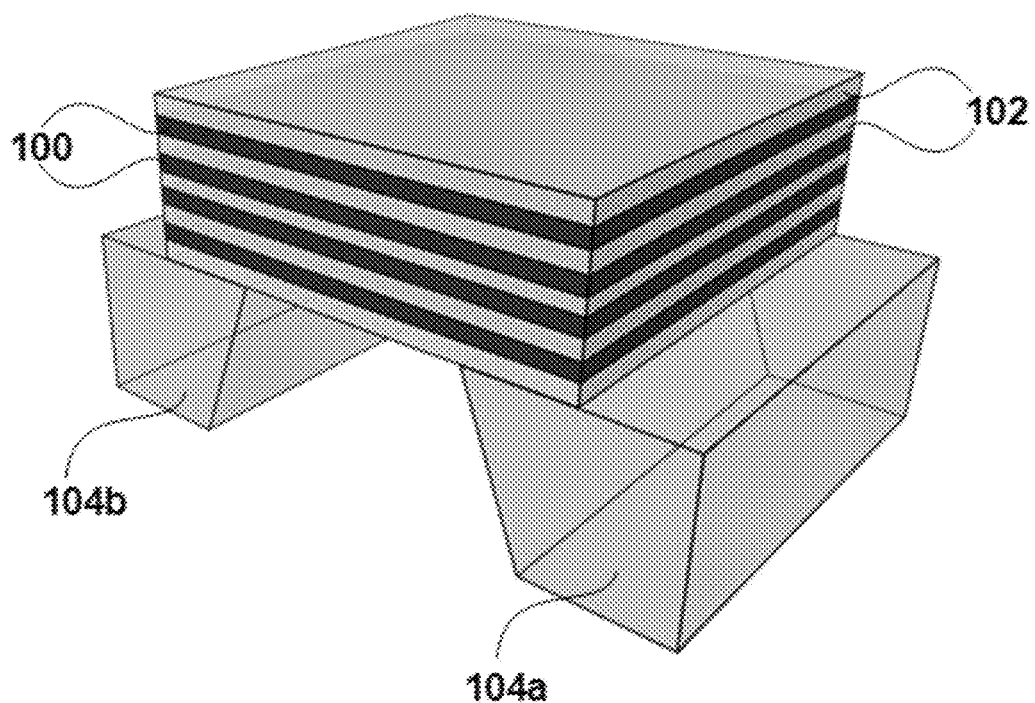
FIG. 3A shows a perspective view of an exemplary SANR architecture with stacked crystalline silicon nanosheets embedded in a SiGe plate, wherein the SiGe plate rests on two supports on either side of a gap.
Figure 3B:
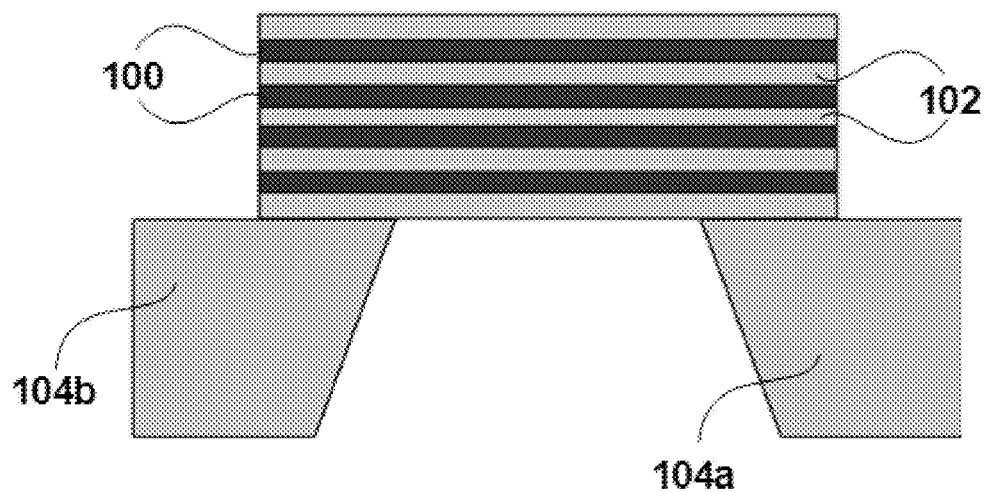
FIG. 3B shows a cross-sectional view of the exemplary SANR architecture of FIG. 3A.

In another aspect, an alternative embodiment is depicted in FIGS. 3A-3B, wherein the SiGe nanofin 102 forms a plate-like structure that can, in some aspects, rest on substrates 104a and 104b wherein a gap exists between the substrates 104a and 104b One or more nanosheets 100 parallel to the substrate are embedded in the SiGe plate or can alternate with one or more nanofins 102.

Figure 4A:
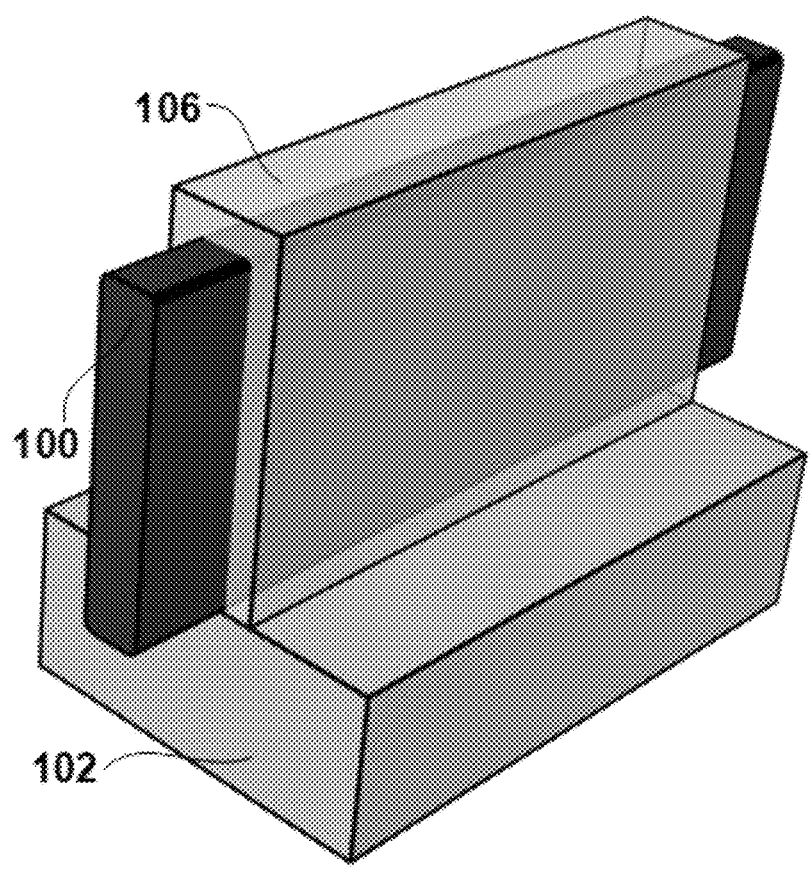
FIG. 4A shows a perspective view of an exemplary SANR architecture with a crystalline silicon nanofin embedded in a SiGe nanofin and surrounded by a semiconductor or insulator cladding.
Figure 4B:
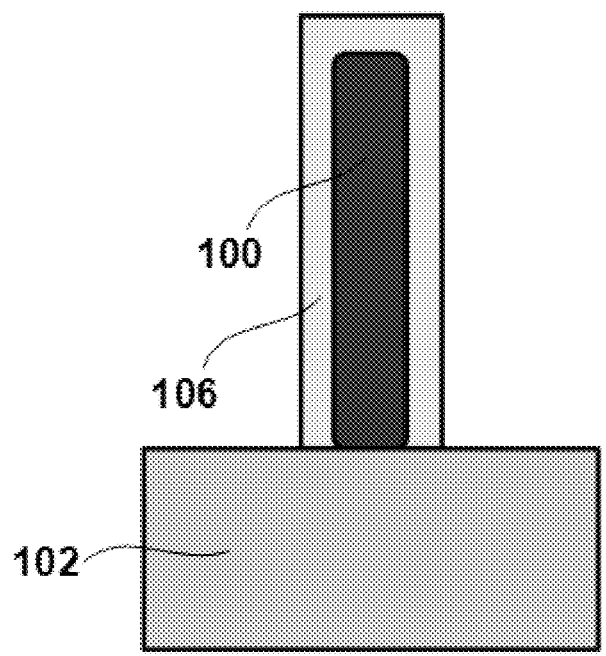
FIG. 4B shows a cross-sectional view of the exemplary SANR architecture of FIG. 4A.

In another aspect, an additional embodiment is depicted in FIGS. 4A-4B, wherein the SiGe structure 102 can optionally surround or not surround an elongated, plate-like single Si nanofin 100 resting on the SiGe structure. The elongated nanofin can, in some aspects, be surrounded by semiconductor or insulator cladding 106. In a further aspect, additional layers can also be present. In one aspect, inclusion of the semiconductor or insulator cladding is not limited to the embodiment shown in FIGS. 4A-4B but can be included on any disclosed structure.

Figure 5A:
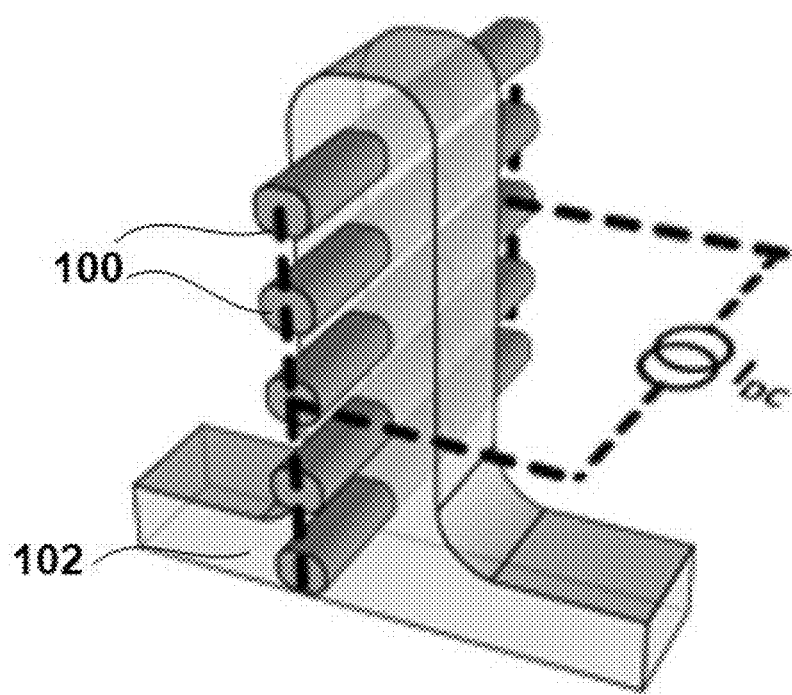
FIG. 5A shows an exemplary Si/SiGe SANR with DC bias applied to the doped Si nanowires.
Figure 5B:
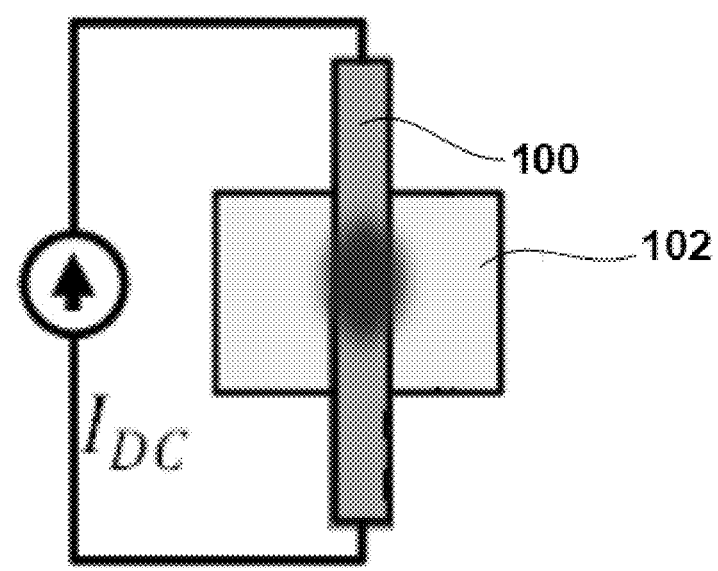
FIG. 5B shows a top view of a cross section of one nanowire from FIG. 5A demonstrating heat generation in the nanowires as a result of the applied DC bias.

In one aspect, the self-amplification mechanism is a result of constructive coherence of a mechanical resonance force with the piezoresistive-thermal reactive force in the nanofin with embedded n-doped nanowires. A DC current is applied through the nanowires creating an internal heat engine through the Joule heating with an operation correlated with the heat capacitance and resistance of the nanowires and the nanofin, and the dynamic resistance of the nanowires (FIGS. 5A-5B). In another aspect, this correlation induces the self-amplification through the cycles shown in FIG. 5C, which can be described as follows.

In one aspect, the disclosed SANR architecture can be realized by a unique thermal oxidation process that leads to extremely enhanced Ge diffusion along the oxidizing interface. FIGS. 8A-8B show that thermal oxidation at around 900° C. of a multilayer Si/SiGe nanofin leads to the ability to create embedded, stacked single-crystalline and dislocation-free Si nanowires embedded in a SiGe fin. In a further aspect, this is caused by the combination of Si diffusion and oxidation and enhanced Ge diffusion along the oxidizing interface. In still another aspect, the final size of the Si nanowires can be controlled by the oxidation time and temperature. In one aspect, the number of stacked Si nanostructures is determined by the number of Si and surrounding SiGe layers in the starting multilayer heterostructure. In a further aspect, the spacing and starting height of the Si nanostructures is also controlled by the parameters of the starting multilayer film, such as Si and SiGe layer thicknesses. In an aspect, the composition of the SiGe layers can also be controlled which can be used to control the final SiGe composition after oxidation, which will affect relevant parameters such as strain in the SANR structure. In any of these aspects, for the SANR structure, current is passed selectively through the nanowires and not the fin, necessitating doping of the nanowires. Thus, in one aspect, the Si layers in the starting multilayer film structure should be appropriately doped, and following oxidation, the resulting Si nanowires should also remain sufficiently doped.

Figure 9A:
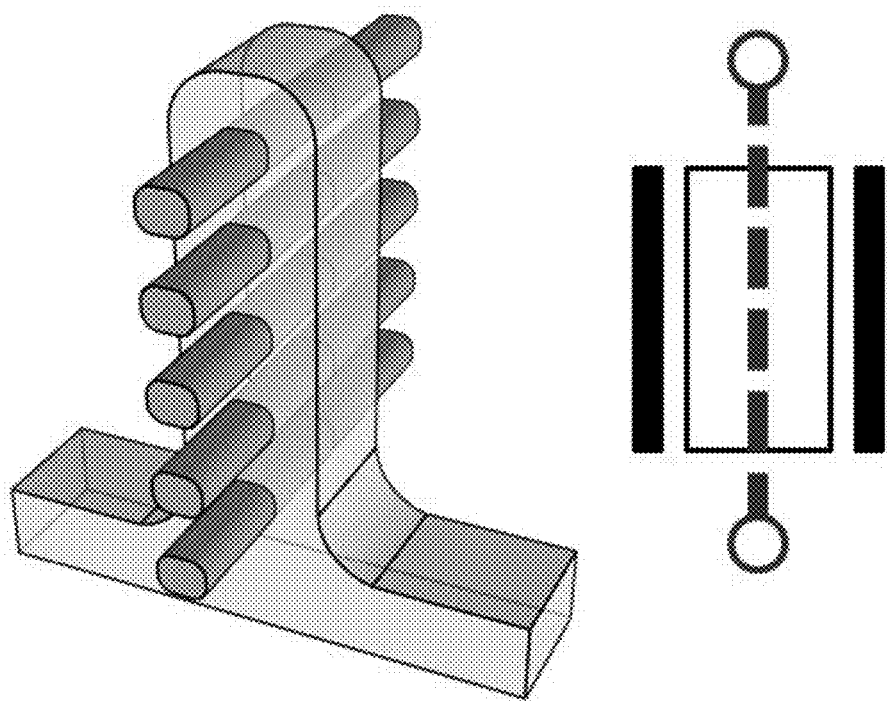
FIG. 9A shows an exemplary architecture of an active Si nanowire transducer and amplifier for use as a self-sustained oscillator. This two-port architecture, in some embodiments, includes a defect-free single crystal and has ultra-high Q.
Figure 9B:
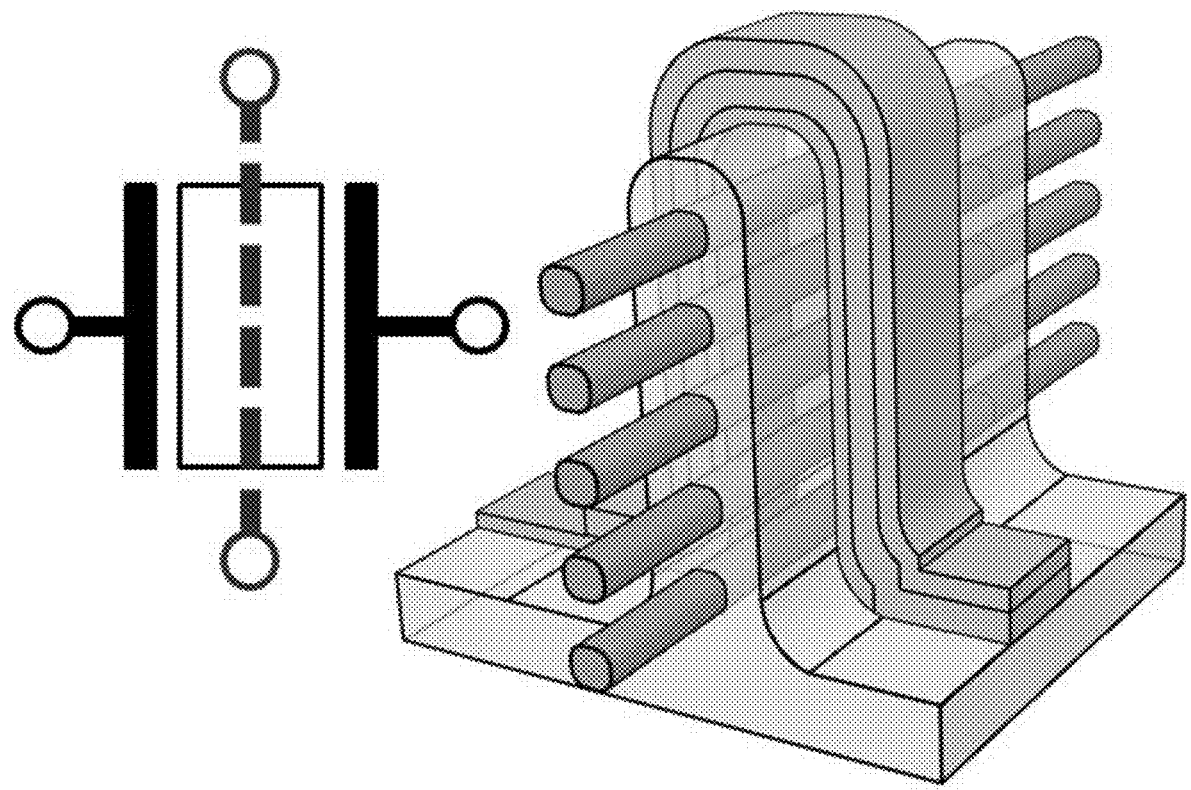
FIG. 9B shows an exemplary architecture of a piezoelectric or ferroic transducer/nanowire amplifier for use as an active switchable filter. This four-port architecture has ultra-low loss and large $k_{eff}^2$.
Figure 10A:
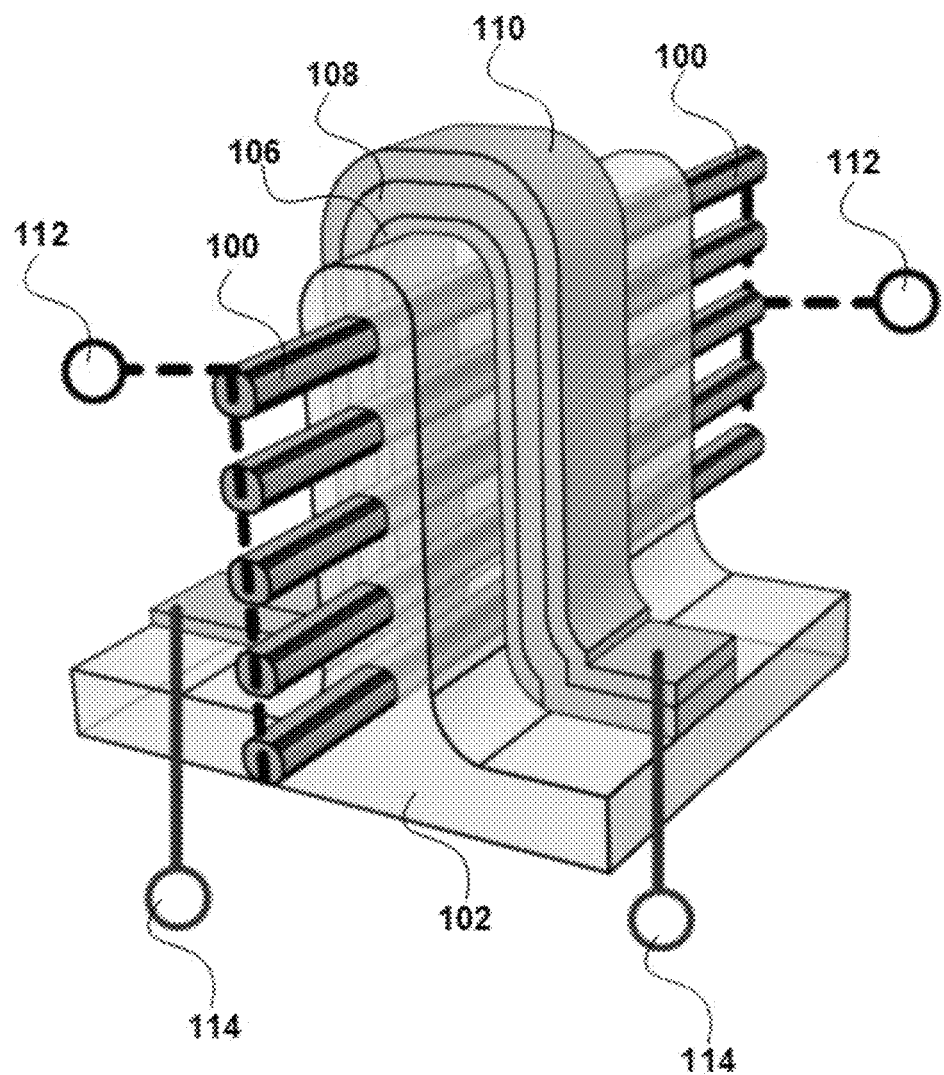
FIGS. 10A-10B show an exemplary ferroic-on-SiGe active FinBAR (integrated four-port transducer) as disclosed herein.
Figure 10B:
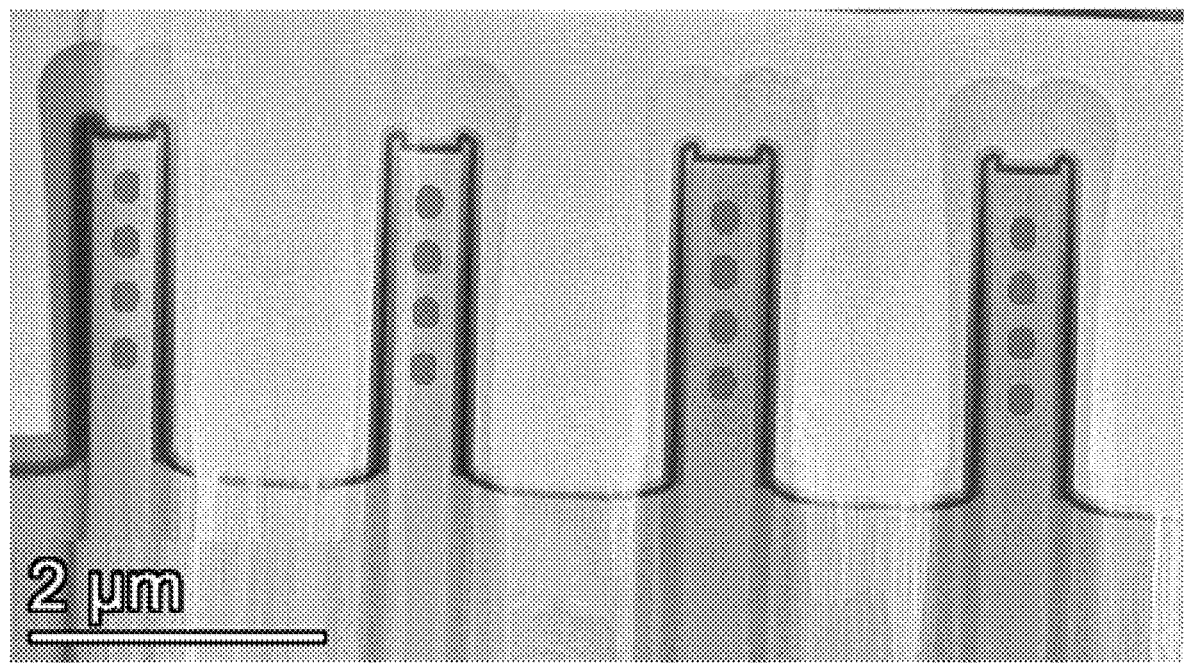
Figure 11:
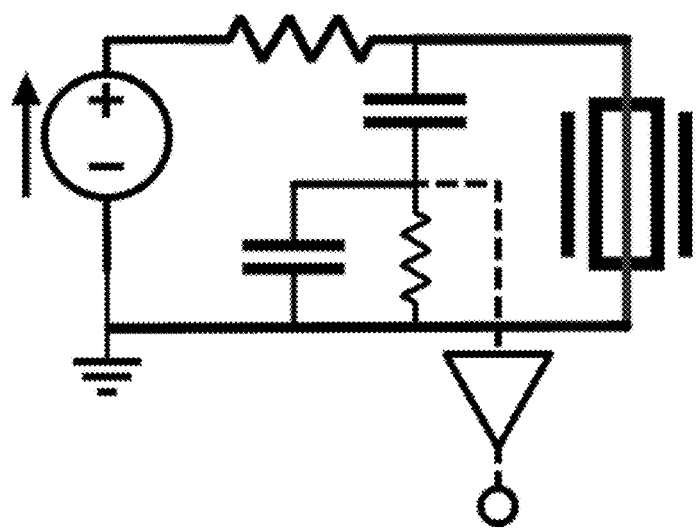
FIG. 11 shows an exemplary circuit diagram incorporating the self-sustained oscillator of FIG. 9A.

In one aspect, an external electromechanical transducer is exploited for excitation of bulk acoustic wave (BAW) resonance modes in the nanowire/nanofin architecture, while the thermal-piezoresistive self-amplification mechanism enables boosting resonator Q. In a further aspect, the transducer is a piezoelectric or ferroic film 108. In one aspect, film 108 is sandwiched between two conductive layers 106 and 110 (see FIG. 9B). In one aspect, film 108 can be made from $Hf_{0.5}Zr_{0.5}O_2$ or a similar material, which can optionally be covered by a conductive material 110 such as, for example, platinum. In a still further aspect, the transducer stack is integrated on the sidewalls of the nanofin through reactive sputtering, atomic-layer-deposition, metalorganic chemical vapor deposition, molecular beam epitaxy, or any combination thereof. In one aspect, the nanofin 102 with integrated transducer is a device with four ports (DC ports 112 and RF ports 114) that provide electrical connection to electrodes on the sidewall and two ends of the nanofin. The 114 ports enable application of an AC electric field to the transducer. The 112 ports enable application of the DC current for self-amplification. See FIGS. 10A-10B for a schematic and micrographs of exemplary structures, respectively.

In some aspects, the device includes an additional dielectric layer, such as silicon dioxide, which is conformally deposited on the fin, or on the transducer enabling compensation of the resonance frequency variations by ambient temperature changes.

Many modifications and other embodiments disclosed herein will come to mind to one skilled in the art to which the disclosed compositions and methods pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of the appended claims. The skilled artisan will recognize many variants and adaptations of the aspects described herein. These variants and adaptations are intended to be included in the teachings of this disclosure and to be encompassed by the claims herein.

Although specific terms are employed herein, they are used in a generic and descriptive sense only and not for purposes of limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

Prior to describing the various aspects of the present disclosure, the following definitions are provided and should be used unless otherwise indicated. Additional terms may be defined elsewhere in the present disclosure.

Definitions

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by," "comprising," "comprises," "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of.

As used in the specification and the appended claims, the singular forms "a," "an" and "the" include plural referents unless the context clearly dictates otherwise. Thus, for example, reference to "a resonator," "a frequency," or "a dopant," include, but are not limited to, mixtures, combinations, or ranges of two or more such resonators, frequencies, or dopants, and the like.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y.' The range can also be expressed as an upper limit, e.g. 'about x, y, z, or less' and should be interpreted to include the specific ranges of 'about x,' 'about y', and 'about z' as well as the ranges of 'less than x', less than y', and 'less than z'. Likewise, the phrase 'about x, y, z, or greater' should be interpreted to include the specific ranges of 'about x,' 'about y,' and 'about z' as well as the ranges of 'greater than x,' greater than y,' and 'greater than z.' In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

As used herein, the terms "optional" or "optionally" means that the subsequently described event or circumstance can or cannot occur, and that the description includes instances where said event or circumstance occurs and instances where it does not.

As used herein, a "nanocomponent" is a component of a larger structure, wherein the nanocomponent has dimensions measurable on the nanometer scale (e.g. from about 10 nm to about 1000 nm, or from about 20 nm to about 1000 nm). "Nanocomponent" encompasses both "nanowires," or structures having a length that is considerably greater than an average cross-sectional diameter, and "nanosheets," or structures having a length and width that are considerably greater than their thicknesses.

"Super high frequency" (SHF) refers to the part of the electromagnetic spectrum for radio frequencies between 3 GHz and 30 GHz. "Extremely high frequency" (EHF), meanwhile, refers to the part of the electromagnetic spectrum for radio frequencies between 30 GHz and 300 GHz.

As used herein, "n-type silicon" refers to silicon that has been doped with phosphorus gas to introduce conductivity into the silicon. In one aspect, the nanocomponents useful herein are composed of n-type silicon.

Quality Factor

Figure 12A:
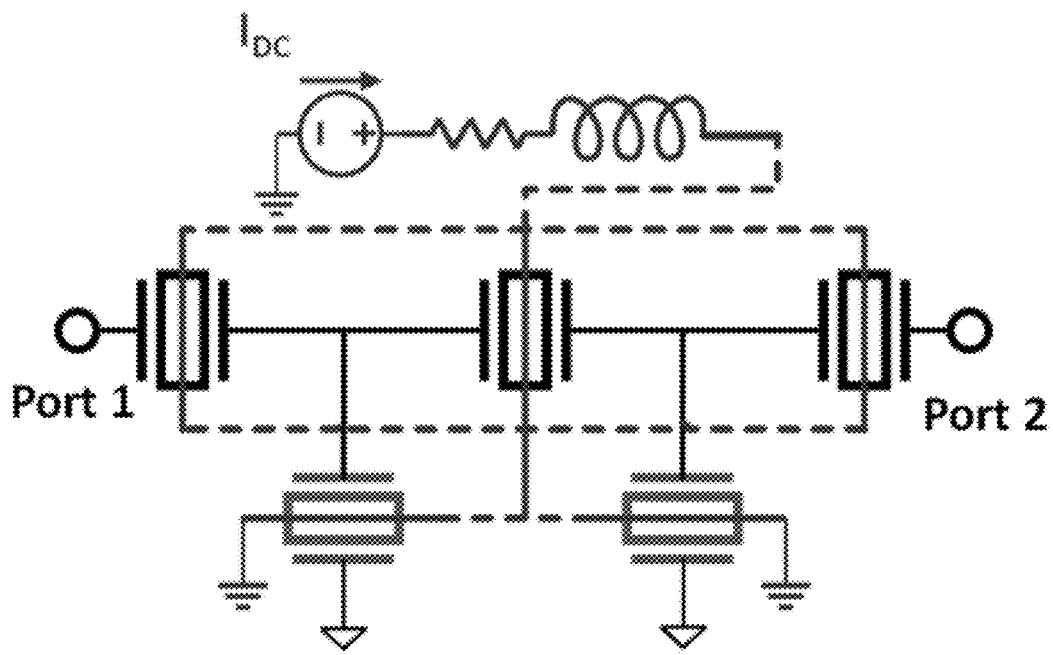
FIG. 12A shows an exemplary circuit diagram incorporating the active filter of FIG. 9B.
Figure 12B:
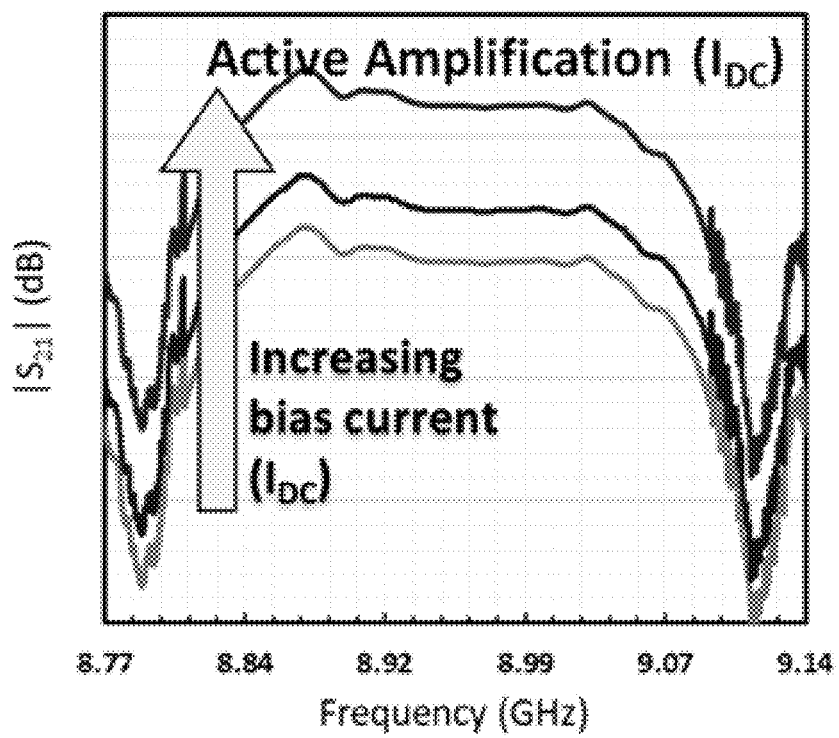
FIG. 12B shows active amplification over the frequency range of 8.77 to 9.14 GHz, achieved from the simulation of exemplary devices under increasing bias.
Figure 13:
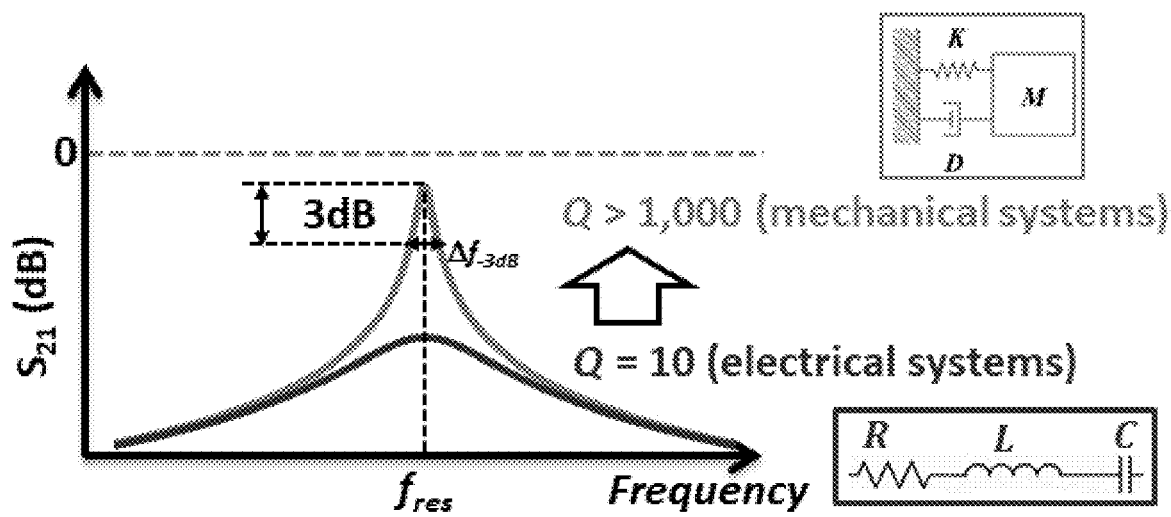
FIG. 13 is a graph showing the variation of quality factor (Q) based on frequency for mechanical and electrical systems.
Figure 14A:
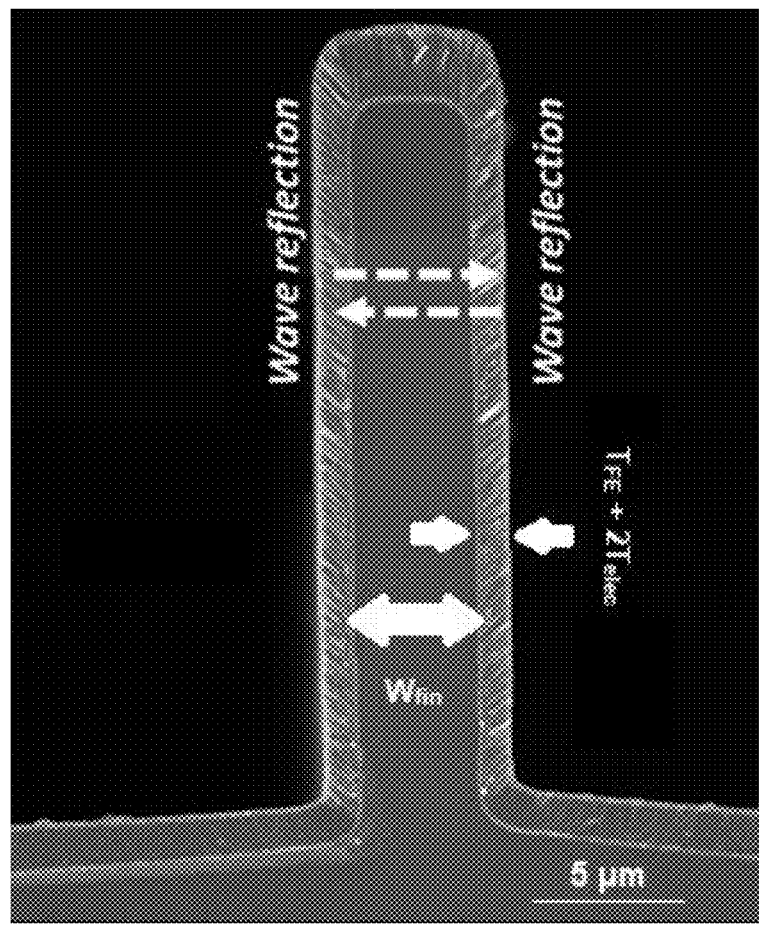
FIG. 14A shows a micrograph of a finBAR with sidewall transducer including parameters that can be optimized or scaled to tailor performance of the device.
Figure 14B:
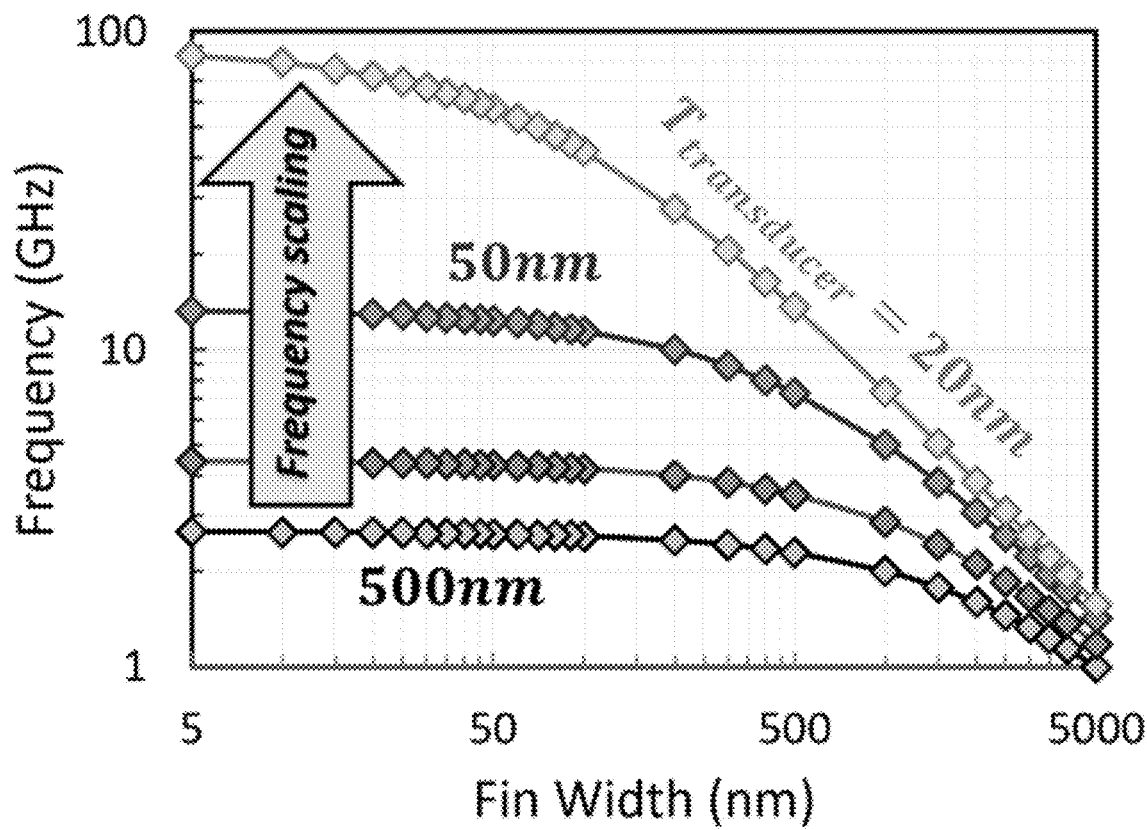
FIG. 14B is a graph of various fin widths versus frequency for different transducer thicknesses.

"Quality factor" or "Q" as used herein relates to the relative energy stored in a system over dissipation per oscillation cycle and further quantifies the sharpness of the resonance peak in the system's frequency response (FIG. 12). In one aspect, Q can be calculated from the following equation:

$$Q = 2\pi \cdot \frac{\text{Stored energy}}{\text{Dissipated energy per cycle}} = \frac{f_{res}}{\Delta f_{-3dB}}$$

where $f_{res}$ and $\Delta f_{-3\,dB}$ are defined as shown in FIG. 13. Dissipation mechanisms in micro- and nano-mechanical resonators can be intrinsic (i.e., due to fundamental properties of a material) or extrinsic (i.e., due to design) and include those listed in Table 1:

TABLE 1

Dissipation Mechanisms in Micro- and Nano-Mechanical Resonators

| Mechanism | Type |
| --- | --- |
| Phonon-Phonon Interaction (defines fundamental limit of Q in MEMS/NEMS resonator) | Intrinsic |
| Phonon-Electron Interaction | Intrinsic |
| Thermoelastic Damping | Intrinsic |
| Polycrystalline Effects: Microscale and Intergranular | Intrinsic |
| Material Imperfections (impurity, defect, dislocation, vacancy, isotope, grain boundary scattering) | Intrinsic |
| Anchoring Energy Leakage | Extrinsic |
| Air/Fluid Damping | Extrinsic |
| Surface and Interfacial Loss | Extrinsic |
| Dielectric Loss | Intrinsic |

In one aspect, a high quality factor is desirable because Q defines the primary performance metrics of oscillators and filters. In oscillators, Q sets the frequency stability, while in filters, Q sets the insertion loss and form-factor of the passband. In another aspect, dissipation due to interaction of vibration with phonons sets the upper limit of a mechanical resonator ($Q_{phonon}$), where $Q_{phonon}$ is inversely proportional to frequency. In a further aspect, since frequency scaling requires extreme miniaturization of resonator size, which induces fabrication imperfections, surface defects, and the like, at higher frequencies, extrinsic loss mechanisms further increase and dominate energy dissipation. In an aspect, Q of known micro- and nano-mechanical resonators drops significantly beyond 3 GHz.

Sidewall Piezoelectric Transducer

In one aspect, excitation of BAW in fins requires a high quality sidewall transducer. In a further aspect, reactive sputtering of AlN is suitable for planar films but challenging for sidewalls. Further in this aspect, energy of ad-atoms reaching the sidewall is not sufficient for textured growth. In one aspect, this feature can be slightly improved by process optimization. However, in an aspect, sidewall films are generally worse in texture density and have inconsistent c-axis orientation.

Reconfigural Spectral Processors for Active Electronically Scanned Array

In one aspect, SANRs as disclosed herein, equipped with a sidewall piezoelectric transducers, enable creation of chip-scale monolithic filter arrays with frequency scalability to Ka band. In a further aspect, computer-controlled phased-array radars require an S- to Ka-band RF front-end with agile configuration. In an aspect, for high-resolution short-range radar applications, with operating frequency in mm-wave regime and for compact unmanned aerial vehicles, the active electronically scanned array (AESA) footprint is significantly scaled, which leaves very limited area to fit RF filter arrays to cover a wide spectrum. In a further aspect, this is a substantial limitation resulting in extensive investment to develop ultra-miniaturized filter technologies; in one aspect, the disclosed devices can be used to construct ultra-miniaturized filters having the required features and performance capabilities.

Stable Oscillators for Tactical Positioning, Navigation, and Timing

In one aspect, integrated oscillators based on quartz crystal and micro-electromechanical systems (MEMS) resonators serve, as a part in conjunction with atomic clocks, to generate ultra-stable low-drift timing and frequency control for positioning, navigation, and timing (PNT) systems. In a further aspect, in these systems, low-frequency (MHz) quartz/MEMS oscillators with high Q along with external amplifiers are used to improve the close-to-carrier phase-noise of oscillators. Further in this aspect, the frequency is then scaled using phase-locked-loops (PLL) to enable coupling and synchronization with atomic clock at ~9 GHz. In one aspect, the use of external amplifiers and PLL imposes significant noise to quartz/MEMS oscillators. In another aspect, and without wishing to be bound by theory, self-sustained SANR oscillators such as those disclosed herein obviate the need for external amplifiers and PLLs, as they benefit from internal thermomechanical amplification (e.g., electrical noise free), and already provide a lithographically defined frequency over 3-30 GHz.

Spread-Spectrum On-Chip Clocks for Massive Computing

In one aspect, with the extreme scaling of processors to accommodate massive computing for artificial intelligence (AI), spread-spectrum clocking is essential to ensure reduction of electromagnetic interference associated with the fundamental frequency of the signal. In a further aspect, this is required to precent destructive interference of systems with one another. In one aspect, the major bottleneck of available spread-spectrum clocks is the significant degradation in their jitter, as they rely on a single resonator architecture and circuit-based techniques for frequency modulation. In a further aspect, this problem can be addressed by using multiple resonators with different frequencies. However, in an aspect, the off-chip nature of available crystal and MEMS resonators does not allow this strategy. Without wishing to be bound by theory, in one aspect, SANR addresses this limitation as it benefits from monolithic integration and lithographical frequency definition, as well as provides high-Q and self-sustained oscillatory operation to enable monolithically integrated spread-spectrum clocks for emerging AI processors.

Chip-Scale Filter Array for 5-6G RF Front-End

In one aspect, new wireless technologies rely on extension of communication bands to mm-wave regime, and simultaneous use of multi-band carrier-aggregation to radically extend the data communication capacity. In a further aspect, software-defined radio techniques based on dynamic band selection are considered essential to accommodate exponential increase in data traffic due to the "internet of things" and metaverse. In one aspect, current chip-scale filter technologies are only operational up to 6 GHz and do not provide on-chip frequency tailorability. In another aspect, SANRs with sidewall piezoelectric transducer enable disruptive filter technologies, extreme frequency scaling to mm-wave, and massive lithographically scalable arraying capability in ultra-small form-factors.

Now having described the aspects of the present disclosure, in general, the following Examples describe some additional aspects of the present disclosure. While aspects of the present disclosure are described in connection with the following examples and the corresponding text and figures, there is no intent to limit aspects of the present disclosure to this description. On the contrary, the intent is to cover all alternatives, modifications, and equivalents included within the spirit and scope of the present disclosure.

ASPECTS

The present disclosure can be described in accordance with the following numbered aspects, which should not be confused with the claims.

Aspect 1. A super high frequency (SHF) or extremely high frequency (EHF) bulk acoustic resonator comprising a nanostructure, the nanostructure comprising:
  a substrate;
  a three-dimensional structure disposed on the substrate, wherein the three-dimensional structure comprises a planar structure having a cross-sectional area comprising a first axis and a second axis and a width, and wherein the width comprises a dimension that is smaller than a dimension of the first axis and a dimension of the second axis, and wherein the planar structure comprises:
    at least one n-type silicon nanocomponent extending along the first axis, the second axis, or both; and
    a matrix material contacting the nanocomponent on at least one side, the matrix material comprising silicon (Si), a silicon:germanium (SiGe) alloy, or germanium (Ge); and
  wherein the at least one nanocomponent has a first dimension extending less than or equal to the width of the planar structure.

Aspect 2. The bulk acoustic resonator of aspect 1, wherein the substrate comprises a substrate material that is the same as the matrix material.

Aspect 3. The bulk acoustic resonator of aspect 1, wherein the substrate comprises a substrate material that is different from the matrix material.

Aspect 4. The bulk acoustic resonator of any one of the preceding aspects, wherein the first axis of the three-dimensional structure is parallel to the substrate and the second axis of the three-dimensional structure is perpendicular to the substrate.

Aspect 5. The bulk acoustic resonator of any one of aspects 1-3, wherein the first axis and the second axis of the three-dimensional structure are parallel to the substrate.

Aspect 6. The bulk acoustic resonator of any one of the preceding aspects, wherein the three-dimensional structure comprises a fin structure comprising a fin width.

Aspect 7. The bulk acoustic resonator of aspect 6, wherein the fin width is from about 20 to about 1000 nm.

Aspect 8. The bulk acoustic resonator of any one of the preceding aspects, wherein the nanocomponent has a second dimension having an approximate length of the first axis, the second axis, or both.

Aspect 9. The bulk acoustic resonator of any one of the preceding aspects, wherein the three-dimensional structure comprises an outer surface comprising SiGe or Ge material.

Aspect 10. The bulk acoustic resonator of any one of the preceding aspects, wherein the bulk acoustic resonator operates at a frequency of from about 100 MHz to about 100 GHz.

Aspect 11. The bulk acoustic resonator of any one of the preceding aspects, wherein the three-dimensional structure comprises a single crystal.

Aspect 12. The bulk acoustic resonator of any one of the preceding aspects, further comprising a dopant in the at least one nanocomponent, the matrix material, or both.

Aspect 13. The bulk acoustic resonator of aspect 12, wherein the dopant is an n-type dopant.

Aspect 14. The bulk acoustic resonator of aspect 12 or 13, wherein the n-type dopant comprises antimony (Sb), phosphorus (P), or arsenic (As).

Aspect 15. The bulk acoustic resonator of any one of the preceding aspects, wherein the at least one nanocomponent does not extend on the outer surface of the three-dimensional structure.

Aspect 16. The bulk acoustic resonator of any one of the preceding aspects, wherein the at least one nanocomponent comprises a nanowire.

Aspect 17. The bulk acoustic resonator of any one of aspects 1-15, wherein the at least one nanocomponent comprises a nanosheet, wherein the nanosheet is perpendicular to the substrate.

Aspect 18. The bulk acoustic resonator of any one of aspects 1-15, wherein the at least one nanocomponent comprises a nanosheet, wherein the nanosheet is parallel to the substrate.

Aspect 19. The bulk acoustic resonator of aspect 18, wherein the at least one nanocomponent comprises a plurality of nanosheets, wherein the matrix material is in the form of a plurality of matrix sheets, and where individual members of the plurality of nanosheets alternate in a stack with individual members of the plurality of matrix sheets.

Aspect 20. The bulk acoustic resonator of any one of aspects 1-19, wherein the at least one nanocomponent comprises two or more nanocomponents, and wherein at least a first one of the two or more nanocomponents differs in at least one dimension from at least a second one of the two or more nanocomponents.

Aspect 21. The bulk acoustic resonator of any one of aspects 1-20, wherein the resonator is partially suspended over a cavity and anchored to the substrate at one or more points.

Aspect 22. The bulk acoustic resonator of any one of the preceding aspects, further comprising an external dielectric layer conformally deposited on the three-dimensional structure.

Aspect 23. The bulk acoustic resonator of aspect 22, wherein the external dielectric layer comprises $SiO_2$.

Aspect 24. The bulk acoustic resonator of any one of the preceding aspects, further comprising a transducer, wherein the transducer comprises a piezoelectric or ferroic film.

Aspect 25. The transducer of any of the preceding aspects, wherein the transducer is sandwiched between a first conductive layer, wherein the first conductive layer is directly adjacent to the nanostructure or is part of the nanostructure, and an external second conductive layer.

Aspect 26. The bulk acoustic resonator of aspect 24 or 25, wherein the piezoelectric or ferroic film comprises aluminum nitride, scandium-doped aluminum nitride, hafnium-zirconium-oxide, or any combination thereof.

Aspect 27. The bulk acoustic resonator of any one of aspects 24-26, wherein the first conductive layer, the second conductive layer, or both, comprise platinum.

Aspect 28. A chip comprising a plurality of bulk acoustic resonators according to any one of aspects 1-27.

Aspect 29. The chip of aspect 28, wherein individual bulk acoustic resonators of the plurality are connected mechanically to other individual bulk acoustic resonators of the plurality through a medium.

Aspect 30. The chip of aspect 29, wherein the medium comprises a dielectric, a metal, or any combination thereof.

Aspect 31. The chip of aspect 30, wherein the dielectric comprises $SiO_2$.

Aspect 32. The chip of aspect 30, wherein the metal comprises platinum.

Aspect 33. A method for amplification of mechanical resonance in the bulk acoustic resonator of any one of the preceding aspects, the method comprising application of direct current through or voltage across the at least one silicon nanocomponent.

Aspect 34. The method of aspect 33, wherein the method does not require use of an external amplifier.

Aspect 35. The method of aspect 33 or 34, wherein the bulk acoustic resonator has a Q factor amplification exceeding 1.

Aspect 36. A device incorporating the bulk acoustic resonator of any one of aspects 1-26 or the chip of any one of aspects 28-32.

Aspect 37. The device of aspect 36, wherein the device comprises an oscillator, a filter, a sensor, an actuator, or a spectral processor for a wireless transceiver.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the disclosure and are not intended to limit the scope of what the inventors regard as their disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1: Theoretical Modeling

Figure 5C:
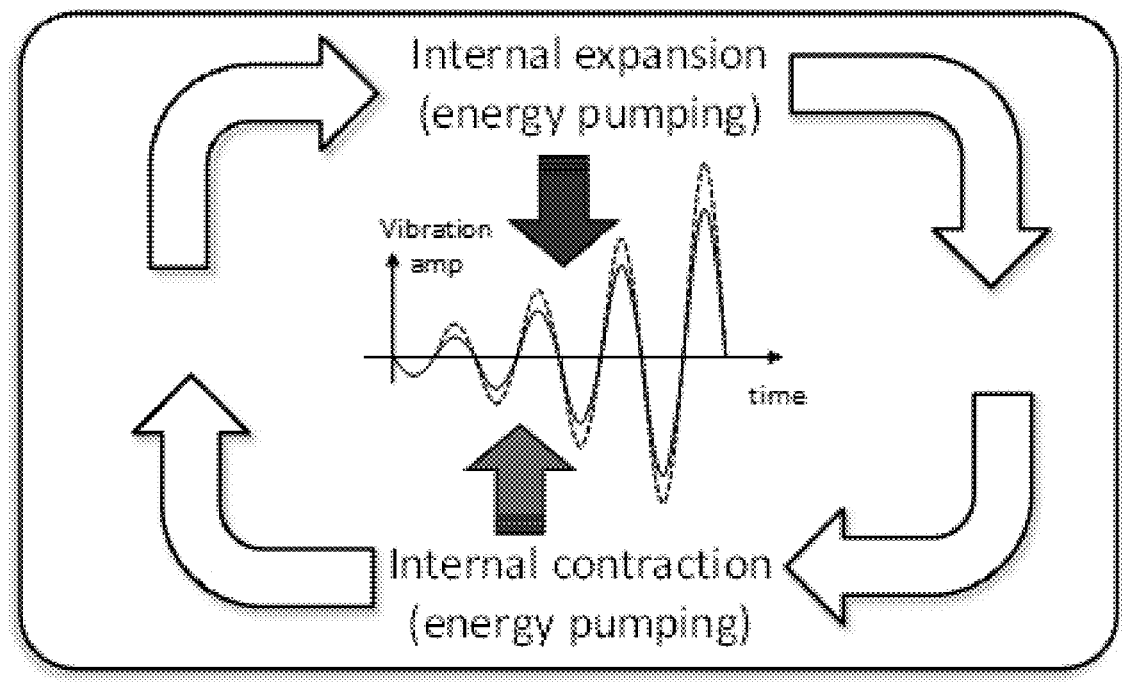
FIG. 5C shows a schematic illustration of the self-oscillation/self-amplification cycle.

Self-amplification through the cycles shown in FIG. 5C can be described as follows:

The harmonic excitation of the fin at a bulk acoustic wave (BAW) resonance mode results in a synchronous strain, with a 90° leading phase compared to the applied force.

$$F_{excitation} = F_0 \sin(2\pi f_{res} t)$$

$$\varepsilon_{xx}(t)|_{at\ the\ central\ axis\ where\ nanowires\ are\ placed} \varepsilon_{xx} \propto F_0 \sin(2\pi f_{res} t - 90°)$$

Here, $F_{excitation}$ is the mechanical excitation force with a magnitude of $F_0$, and at resonance frequency $f_{res}$. $E_{xx}$ is the strain at the central axis if the nanofin, where the nanowires are placed.

This strain modulates the electrical resistance of the nanowire due to the piezoresistive effect. When the nanowire is formed from an n-type semiconductor with negative piezoresistive coefficient, the resistance modulation is 180° out-of-phase with respect to the strain function.

$$R = R_0 + \Delta R(t)$$

$$\Delta R(t) \propto \pi_L \varepsilon_{xx}(t) \propto F_0 \sin(2\pi f_{res} t - 90° - 180°)$$

Here, R is the resistance of the nanowires. $R_0$ is the initial resistance under rest and $\Delta R$ is the result of piezoresistive modulation. $\pi_L$ is the piezo resistive coefficient of the nanowire, which is a negative value for n-doped semiconductors.

Considering a constant current applied across the nanowire, the modulating resistance induces temperature fluctuations at the same frequency (i.e., the BAW resonance frequency). The relative phase of this temperature fluctuations depends on the thermal time constant ($\tau_{thermal}$) of the nanowire relative to the BAW resonance frequency.

$$\tau_{thermal} = R_{thermal} C_{thermal}$$

Here, $R_{thermal}$ and $C_{thermal}$ are the thermal resistance and capacitance of the nanowires, respectively. When the nanowire cross-section is small enough and/or the BAW resonance frequency is large enough $$(\text{i.e., } \tau_{thermal} \gg \frac{1}{2\pi f_{res}}),$$

the nanowire represents a lossless heat capacitor, and the temperature fluctuations lead the electrical resistance variations by 90° in phase. Finally, the temperature fluctuations (Temp(t)) induce a force ($F_{self-amp}$) with the same frequency and phase, due to thermal expansion effect.

$$F_{self-amp} = \alpha \cdot \text{Temp}(t) \propto \Delta R(t) \propto F_0 \sin(2\pi f_{res} t - 90° - 180° - 90°) \propto F_0 \sin(2\pi f_{res} t)$$

Here, $\alpha$ is the thermal expansion coefficient of the nanowire. Considering the overall phase shift over this cycle, the resulting harmonic thermal expansion force is in-phase with the initial excitation force and amplifies it, with a rate defined by:

$$\text{Amplification rate} \propto \frac{\alpha \cdot \pi_L \cdot I_{DC}^2}{C_{thermal}}$$

Figure 6:
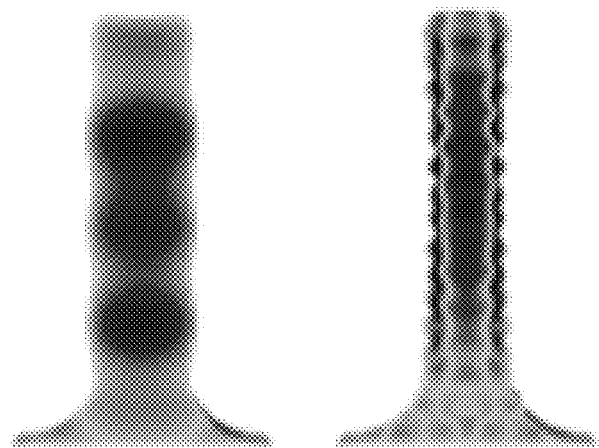
FIG. 6 shows simulated resonance modes for one example embodiment of an SANR. Left: the mode shape for the resonator operating in the first width-extensional mode ($WE_1$) at 25.7 GHz. Right: the mode shape for the resonator operating in the third width-extensional mode ($WE_3$) at: 68 GHZ.

While the self-amplification rate is quadratically proportional to the applied DC current, the unique architecture of the nanofin with self-embedded nanowires enables achieving large amplifications with very low power consumption. First, the self-aligned placement of the nanowires in the central axis of the nanofin, thanks to the unique fabrication process, coincides with the maximum-stress region of the width-extensional BAW resonance modes of the nanofin (FIG. 6, left and right images). Such maximum-stress region results in the maximum attainable resistance modulation in the nanowires with minimum power consumption. Second, the ultra-miniaturized cross-sectional area of the nanowires results in their small heat capacitance. This translates to the very small thermal time constant of the heat-engine, which enables efficiency self-amplification in resonators with extremely high frequencies. We note that the self-amplification effect and SANR concept figure can still be realized with stacked conductive layers which are not embedded as nanowires (such as multilayer Si/SiGe fin shown in FIG.

8A), although the performance will be less ideal than having the conductive elements as embedded nanowires for the reasons above.

Figure 7A:
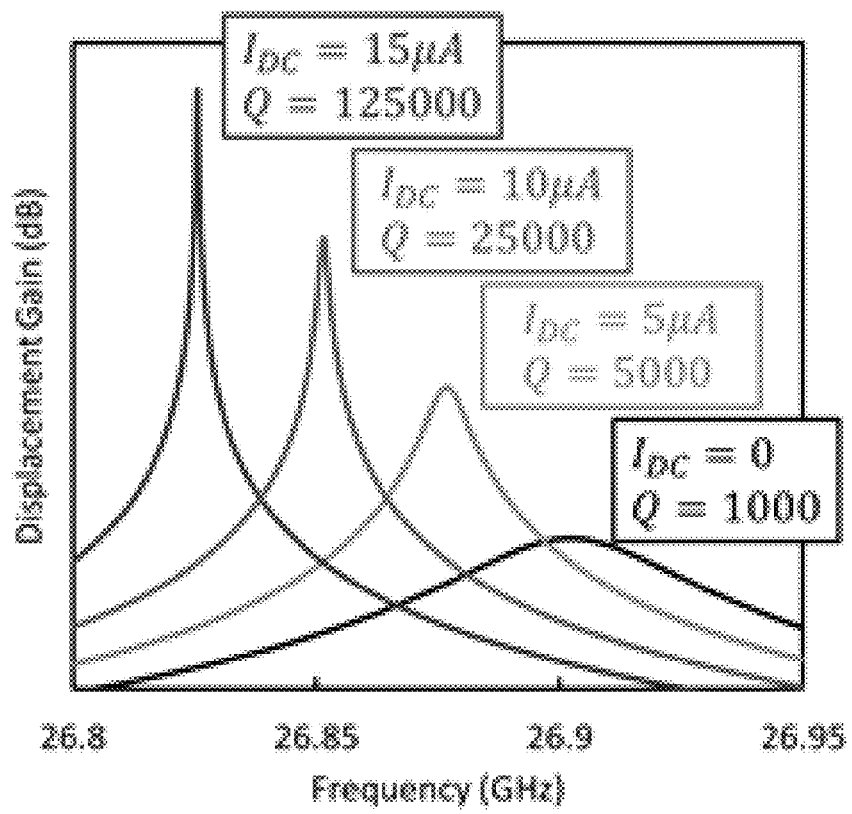
FIG. 7A shows calculated displacement gain vs. frequency for four different applied DC currents with predicted Q values.
Figure 7B:
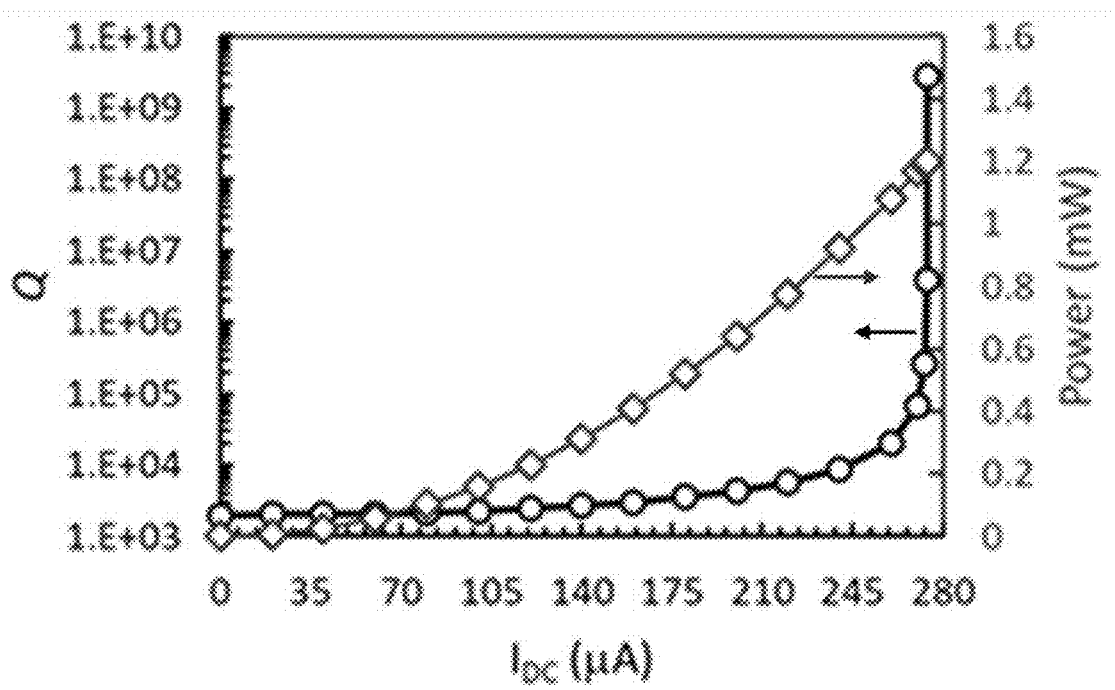
FIG. 7B shows calculated Q and power consumption vs. applied DC current.

The initial excitation force can be either generated by an external transducer, or due to the thermal noise of the ambient with a finite temperature. In the former case, the piezoresistive-thermal cycle serves as an internal amplifier that compensates the natural energy dissipation in the structure and enhances its Q (FIG. 7A). In this case, increasing the DC current bias nonlinearly increase the Q, while consuming more power (FIG. 7B).

In the latter case (i.e., in the absence of any external transducer), the thermal noise or the random-walk induced at the switching of the current source, has a wideband spectral density with a finite value at the BAW resonance frequency. This noise/random-walk is sufficient for initial excitation of BAW resonance, as the resonator serves as an inherent filter damping other frequency content of the noise/random-walk.

The thermal-piezoresistive self-amplification mechanism injects mechanical energy with a rate tunable by the applied DC current, opposing the intrinsic energy dissipation mechanisms in the resonator. The steady state of the resonator oscillation depends on self-amplification rate relative to the energy naturally dissipated by intrinsic thermomechanical nonlinearities in the mechanical resonator.

Figure 7C:
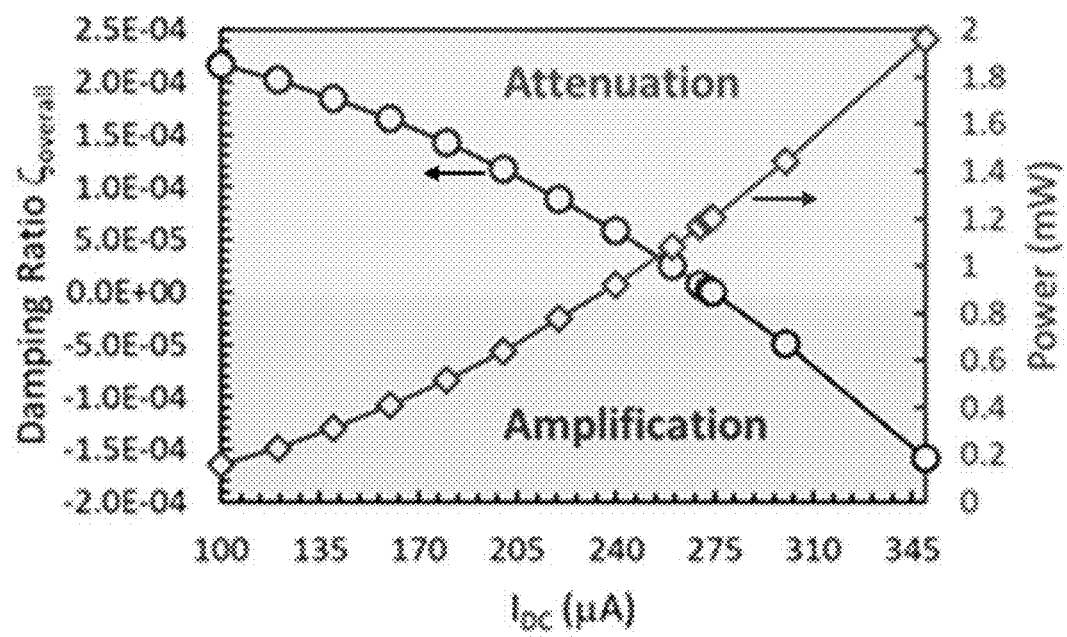
FIG. 7C is a plot showing amplification regime suitable for self-sustained oscillation and amplification.

When the self-amplification rate exceeds intrinsic energy dissipation rate, the oscillation amplitude grows into a bistable regime bounded by the dynamic range of the current source applied to the nanowire (the amplification regime shown in FIG. 7C). This regime of operation is suitable for creation of self-sustained oscillator without the need for any external circuitry. The bistable oscillatory function can be optimized to create a sinusoidal waveform, through the use of a simple passive low-pass filter, or an amplitude-limiter buffer.

Example 2: Variable Thickness Calculation

Figure 15:
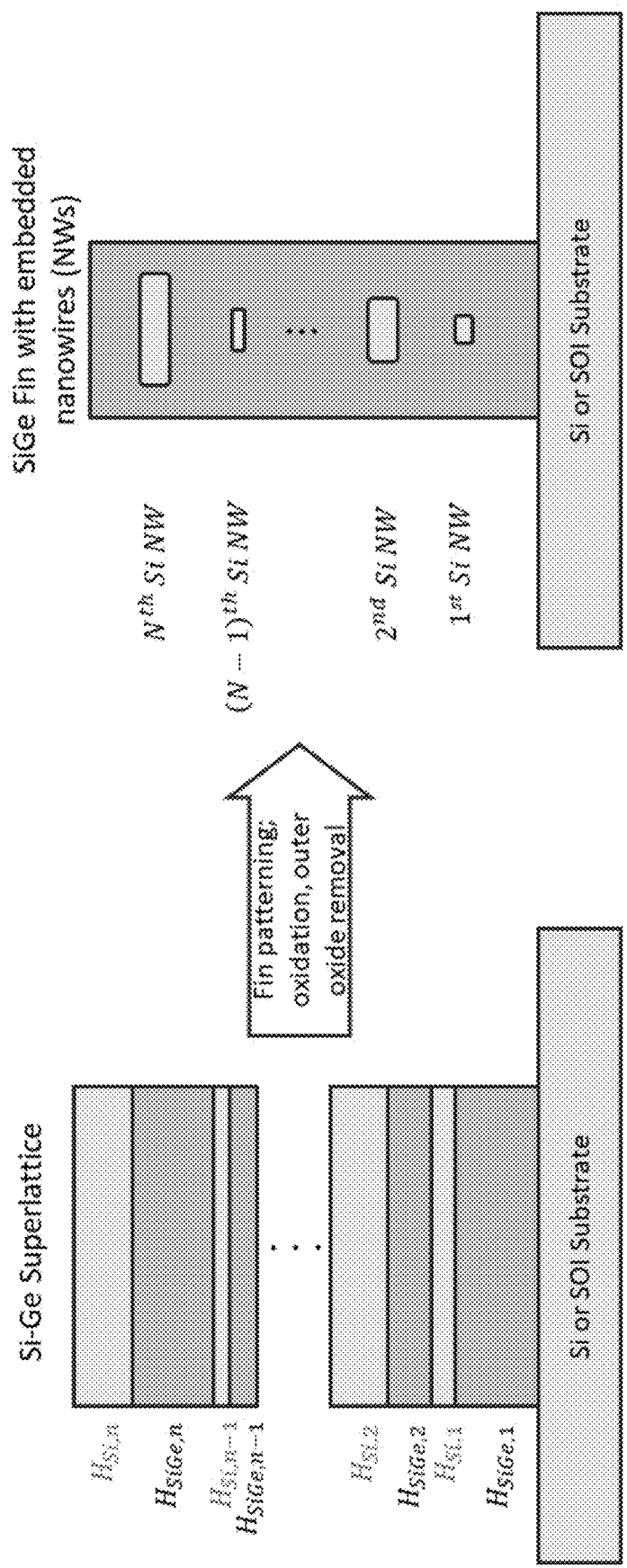
FIG. 15 depicts an exemplary embodiment of the present disclosure showing a structurally heterogeneous Si—SiGe resonator where Si bodies with different dimensions are distributed within the SiGe fin. This embodiment can be realized by growing a Si—Ge superlattice where Si and Ge layers have different thicknesses across the stack. When this stack is subjected to patterning of the fin, oxidation and removal of oxide, the resonator is created where Si nanowires with arbitrary dimensions across fin height are embedded within the SiGe nanofin.

Also disclosed herein is a structure heterogeneous Si—SiGe resonator where the Si bodies with different dimensions are distributed within the SiGe fin. This embodiment can be realized by growing a Si—Ge superlattice where Si and Ge layers have different thicknesses across the stack. When this stack is subjected to patterning of the fin, oxidation and removal of oxide, the resonator is created where Si nanowires with arbitrary dimensions across fin height are embedded within the SiGe nanofin, as shown in FIG. 15.

The control over dimension of nanowires within the nanofin enables engineering dispersion of bulk acoustic waves and enables suppression or frequency-shift of spurious modes in the spectrum near the targeted width-extensional mode. Spurious mode suppression and mechanical energy localization is achieved through nanowire thickness grading along the height of a fin.

Figure 16:
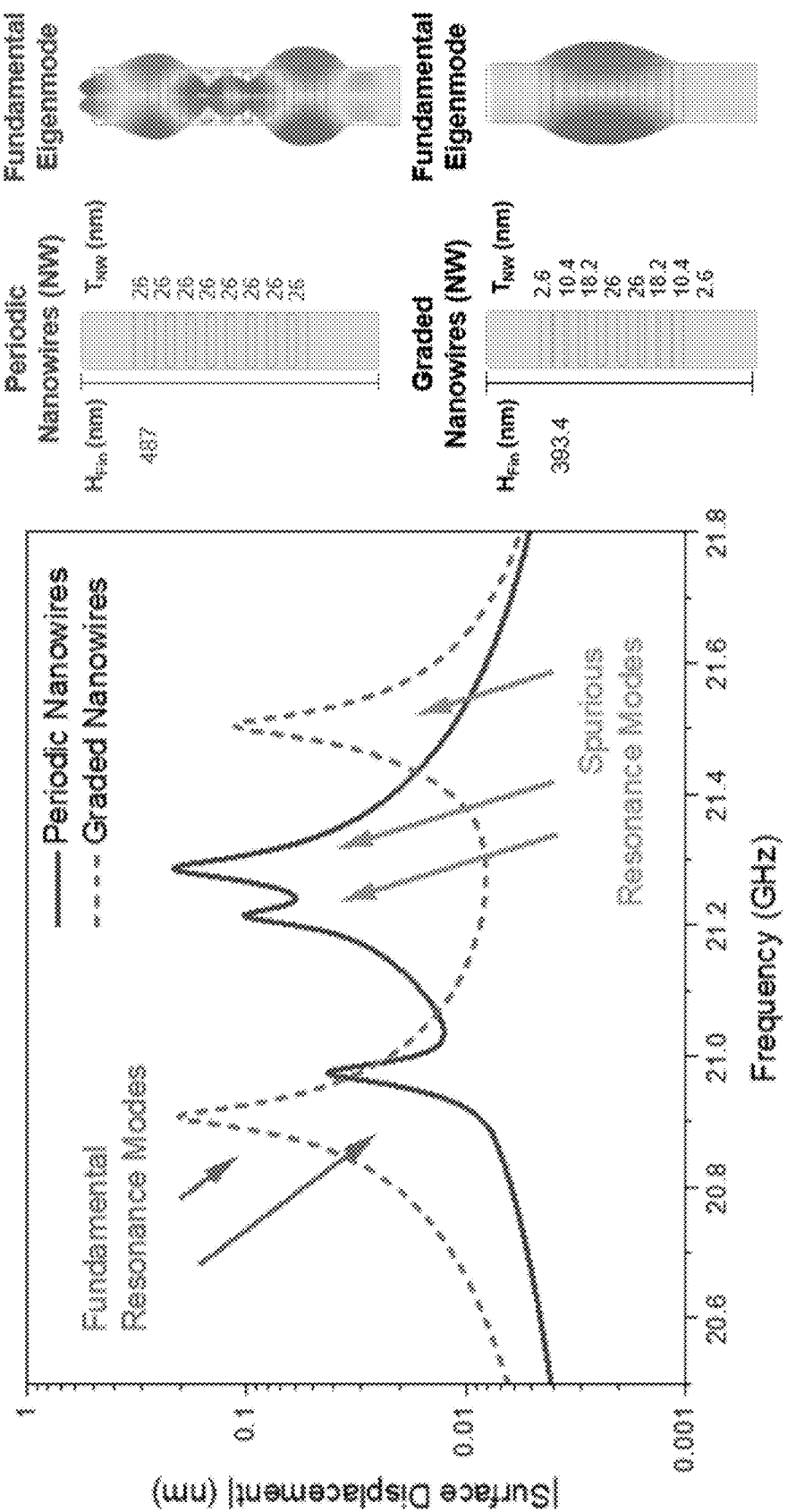
FIG. 16 shows a graded fin is formed by increasing nanowire thickness from 2.6 nm to 26 nm, in 30% increments, through the bottom four nanowires. The top four wires are inversely graded, with thickness decreasing from 26 nm to 2.6 nm, in 30% increments. For comparison, a periodic (ungraded) fin structure is comprised of consistently spaced nanowires each with identical thickness of 26 nm. Frequency domain simulations in COMSOL Multiphysics confirm spurious mode suppression and enhancement of the targeted width extensional mode in the graded design (dashed curve) compared to the periodic design (solid curve).

An exemplary case is shown in FIG. 16. A graded fin is formed by increasing nanowire thickness from 2.6 nm to 26 nm, in 30% increments, through the bottom four nanowires. The top four wires are inversely graded, with thickness decreasing from 26 nm to 2.6 nm, in 30% increments. For comparison, a periodic (ungraded) fin structure is comprised of consistently spaced nanowires each with identical thickness of 26 nm. Frequency domain simulations in COMSOL Multiphysics confirm spurious mode suppression and enhancement of the targeted width extensional mode in the graded design (dashed curve) compared to the periodic design (solid curve) as shown in FIG. 16. The graded fin is seen to have a larger overall displacement of the targeted mode and only one spurious mode from 20.5 GHz to 21.8 GHz, compared to three spurious modes exhibited by a periodic fin in the same frequency range. Mechanical energy localization is confirmed by comparison of targeted (fundamental) first width extensional eigenmode shapes for graded and periodic fins. Graded fins exhibit acoustic energy confinement along the height of a fin, evidenced by large, uniform sidewall displacement. In contrast, periodic fins allow additional waves to couple to the fundamental width extensional mode, yielding smaller amplitude, nonuniform sidewall displacement.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

What is claimed is:

1. A super high frequency (SHF) or extremely high frequency (EHF) bulk acoustic resonator comprising a nanostructure, the nanostructure comprising:
   a substrate;
   a three-dimensional structure disposed on the substrate, wherein the three-dimensional structure comprises a planar structure having a cross-sectional area comprising a first axis and a second axis and a width, and wherein the width comprises a dimension that is smaller than a dimension of the first axis and a dimension of the second axis, and wherein the planar structure comprises:
      at least one n-type silicon nanocomponent extending along the first axis, the second axis, or both; and
      a matrix material contacting the nanocomponent on at least one side, the matrix material comprising silicon (Si), a silicon:germanium (SiGe) alloy, or germanium (Ge);
   wherein the at least one nanocomponent has a first dimension extending less than or equal to the width of the planar structure;
      wherein the at least one nanocomponent comprises a plurality of nanosheets, wherein the plurality of nanosheets are parallel to the substrate, and wherein the matrix material is in the form of a plurality of matrix sheets, and where individual members of the plurality of nanosheets alternate in a stack with individual members of the plurality of matrix sheets.

2. The bulk acoustic resonator of claim 1, wherein the first axis of the three-dimensional structure is parallel to the substrate and the second axis of the three-dimensional structure is perpendicular to the substrate.

3. The bulk acoustic resonator of claim 1, wherein the first axis and the second axis of the three-dimensional structure are parallel to the substrate.

4. The bulk acoustic resonator of claim 1, wherein the three-dimensional structure comprises a fin structure comprising a fin width of from about 20 to about 1000 nm.

5. The bulk acoustic resonator of claim 1, wherein the three-dimensional structure comprises an outer surface comprising SiGe or Ge.

6. The bulk acoustic resonator of claim 1, wherein the bulk acoustic resonator operates at a frequency of from about 100 MHz to about 100 GHz.

7. The bulk acoustic resonator of claim 1, wherein the three-dimensional structure comprises a single crystal.

8. The bulk acoustic resonator of claim 1, further comprising an n-type dopant in the at least one nanocomponent, the matrix material, or both.

9. The bulk acoustic resonator of claim 8, wherein the n-type dopant comprises antimony (Sb), phosphorus (P), or arsenic (As).

10. The bulk acoustic resonator of claim 1, wherein the at least one nanocomponent comprises a nanowire.

11. The bulk acoustic resonator of claim 1, wherein the at least one nanocomponent comprises a nanosheet, wherein the nanosheet is perpendicular to the substrate.

12. The bulk acoustic resonator of claim 1, wherein the at least one nanocomponent comprises two or more nanocomponents, and wherein at least a first one of the two or more nanocomponents differs in at least one dimension from at least a second one of the two or more nanocomponents.

13. The bulk acoustic resonator of claim 1, wherein the resonator is partially suspended over a cavity and anchored to the substrate at one or more points.

14. The bulk acoustic resonator of claim 1, further comprising an external dielectric layer conformally deposited on the three-dimensional structure.

15. The bulk acoustic resonator of claim 1, further comprising a transducer, wherein the transducer comprises a piezoelectric or ferroic film sandwiched between a first conductive layer, wherein the first conductive layer is directly adjacent to the nanostructure or is a part of the nanostructure, and an external second conductive layer.

16. The bulk acoustic resonator of claim 15, wherein the piezoelectric or ferroic film comprises aluminum nitride, scandium-doped aluminum nitride, hafnium-zirconium-oxide, or any combination thereof.

17. A device incorporating the bulk acoustic resonator of claim 1.

18. The device of claim 17, wherein the device comprises an oscillator, a filter, a sensor, an actuator, or a spectral processor for a wireless transceiver.

* * * * *